US 9,852,931 B2

(12) United States Patent
Miyagi et al.

(10) Patent No.: US 9,852,931 B2
(45) Date of Patent: *Dec. 26, 2017

(54) SUBSTRATE PROCESSING APPARATUS

(71) Applicant: DAINIPPON SCREEN MFG. CO., LTD., Kyoto (JP)

(72) Inventors: Masahiro Miyagi, Kyoto (JP); Masanobu Sato, Kyoto (JP); Hiroyuki Araki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 514 days.

This patent is subject to a terminal disclaimer.

(21) Appl. No.: 14/340,218

(22) Filed: Jul. 24, 2014

(65) Prior Publication Data

US 2014/0352742 A1 Dec. 4, 2014

Related U.S. Application Data

(63) Continuation of application No. 11/853,231, filed on Sep. 11, 2007, now Pat. No. 8,815,048.

(30) Foreign Application Priority Data

Sep. 15, 2006 (JP) .................................. 2006-251637
Dec. 5, 2006 (JP) .................................. 2006-327938
Dec. 5, 2006 (JP) .................................. 2006-328648

(51) Int. Cl.
*H01L 21/67* (2006.01)
(52) U.S. Cl.
CPC .............................. *H01L 21/67051* (2013.01)
(58) Field of Classification Search
USPC ...................................................... 134/104.2
See application file for complete search history.

(56) References Cited

U.S. PATENT DOCUMENTS 5,689,749 A 11/1997 Tanaka et al. ................ 396/611
5,826,130 A 10/1998 Tanaka et al. ................ 396/611
(Continued)

FOREIGN PATENT DOCUMENTS

JP 9-289156 11/1997
JP 10-258249 9/1998
(Continued)

OTHER PUBLICATIONS

Taiwanese Letters Patent issued Feb. 21, 2012 in connection with corresponding Taiwanese Patent Application No. 96134198.
(Continued)

*Primary Examiner* — Sylvia R MacArthur
(74) *Attorney, Agent, or Firm* — Ostrolenk Faber LLP

(57) ABSTRACT

A substrate processing apparatus has a cup part for receiving processing liquid such as pure water which is splashed from a substrate. The cup part is formed of electrical insulation material or semiconductor material. Hydrophilic treatment may be performed on an outer annular surface of the cup part and water may be held on the outer annular surface of the cup part while processing the substrate. With the disclosed apparatus, charged potential of the cup part generated by splashing of pure water can be suppressed, without greatly increasing the manufacturing cost of the substrate processing apparatus. As a result, it is possible to prevent electric discharge from occurring on the substrate due to induction charging of the substrate, in application of the processing liquid onto the substrate.

20 Claims, 19 Drawing Sheets

(56) References Cited

U.S. PATENT DOCUMENTS

| | | | |
|---|---|---|---|
| 5,871,584 A | 2/1999 | Tateyama et al. | 118/323 |
| 5,997,653 A | 12/1999 | Yamasaka | 134/2 |
| 6,247,479 B1 | 6/2001 | Taniyama et al. | 134/95.2 |
| 2006/0102069 A1 | 5/2006 | Tokuri et al. | 118/52 |
| 2008/0070418 A1 | 3/2008 | Miyagi et al. | 438/745 |
| 2008/0178917 A1* | 7/2008 | Miyagi | B08B 3/10 134/57 R |
| 2014/0352742 A1* | 12/2014 | Miyagi | H01L 21/67051 134/104.2 |

FOREIGN PATENT DOCUMENTS

| | | |
|---|---|---|
| JP | 11-283914 | 10/1999 |
| JP | 2003-100687 | 4/2003 |
| JP | 2003-264167 | 9/2003 |
| JP | 2004-63201 | 2/2004 |
| JP | 2004-356299 | 12/2004 |
| JP | 2006-147672 | 6/2006 |
| KR | 10-0262902 | 3/1996 |

OTHER PUBLICATIONS

Chinese Office Action dated Aug. 20, 2010 in connection with corresponding Chinese Patent Application No. 200710153720.1.

Japanese Office Action dated Dec. 21, 2010 in connection with corresponding Japanese Patent Application No. 2006-328648.

Notice of Decision to Grant a Patent dated Oct. 14, 2009 by the Korean Intellectual Property Office in connection with the divisional application of the counterpart Korean Patent Application No. 10-2008-126420.

Notice of Decision to Grant a Patent dated Apr. 29, 2009 in connection with corresponding Korean Patent Application No. 10-2007-88056.

* cited by examiner

I-I

II — II

III—III

SUBSTRATE PROCESSING APPARATUS

CROSS-REFERENCE TO RELATED APPLICATIONS

This application is a continuation of U.S. patent application Ser. No. 11/853,231, filed Sep. 11, 2007, which claims the benefit of Japanese Patent Application No. 2006-251637, filed Sep. 15, 2006, Japanese Patent Application No. 2006-327938, filed Dec. 5, 2006, and Japanese Patent Application No. 2006-328648, filed Dec. 5, 2006 incorporated herein by reference.

BACKGROUND OF THE INVENTION

Field of the Invention

The present invention relates to a technique for processing a substrate by applying processing liquid onto the substrate.

Description of the Background Art

In a manufacturing process of a semiconductor substrate (hereinafter, simply referred to as "substrate"), various processings have been conventionally performed on the substrate, on which an insulating film such as an oxide film is formed, with using a substrate processing apparatus. For example, a processing of etching or the like is performed on a surface of the substrate by applying processing liquid onto the substrate while rotating the substrate around the central axis perpendicular to its main surface. Processing liquid splashed from the rotating substrate is received by a cup part (splash guard) surrounding the substrate, thereby preventing the processing liquid from being splashed outside the apparatus. Such a cup part is normally formed of electrical insulation material such as fluorine resin or vinyl chloride resin, from the viewpoint of corrosion resistance against the processing liquid.

Japanese Patent Application Laid-Open No. 11-283914 (Document 1) discloses a method of preventing a cup part from being charged in processing of a substrate by forming the cup part with antistatic plastic material in a substrate processing apparatus. Japanese Patent Application Laid-Open No. 2004-356299 and Japanese Patent Application Laid-Open No. 2006-147672 disclose substrate processing apparatuses where hydrophilic treatment is performed on an inner annular surface of a cup part or an outer annular surface of an inner cup part in a case where a plurality of cup parts are provided concentrically. In the substrate processing apparatuses, suppressed is re-adherence of processing liquid, which is splashed from a substrate, to the substrate by rebounding from the cup part or the like.

In the meantime, a process using pure water as the processing liquid (cleaning process, for example) is performed in the substrate processing apparatus. In this process, frictional charging in a cup part with insulating properties is caused by pure water with high resistivity (specific resistance) which is splashed from a substrate, and then the main body of the substrate is charged by induction due to electric field generated by the cup part. When processing liquid with conductivity is applied onto the substrate in the above state, insulating properties of an insulating film is broken and electric discharge occurs between the processing liquid applied onto the substrate and the main body of the substrate with interposing the insulating film. Though it is thought to form the whole cup part with antistatic plastic material as disclosed in Document 1, such special material is expensive to greatly increase the manufacturing cost of the substrate processing apparatus.

SUMMARY OF THE INVENTION

The present invention is intended for a substrate processing apparatus for processing a substrate by applying processing liquid onto the substrate. It is an object of the present invention to prevent electric discharge from occurring on the substrate due to induction charging of the substrate which is caused by charging of a cup part generated in splashing of pure water, without greatly increasing the manufacturing cost of the substrate processing apparatus.

The substrate processing apparatus in accordance with the present invention comprises a holding part for holding a substrate; a processing liquid applying part for applying pure water, which is one type of processing liquid, onto the substrate; and a cup part whose main body is formed of electrical insulation material or semiconductor material, the cup part having an annular sidewall surrounding the holding part to receive processing liquid splashed from the substrate, the annular sidewall having an internal portion with a resistivity which is smaller than that of the electrical insulation material forming the main body.

According to the present invention, it is possible to suppress charged potential of the cup part generated in splashing of pure water, without greatly increasing the manufacturing cost of the substrate processing apparatus, thereby preventing electric discharge from occurring on the substrate due to induction charging of the substrate.

Another preferred substrate processing apparatus comprises a holding part for holding a substrate; a processing liquid applying part for applying pure water, which is one type of processing liquid, onto the substrate; and a cup part whose main body is formed of electrical insulation material or semiconductor material, the cup part surrounding the holding part to receive processing liquid splashed from the substrate, at least one surface of an inner annular surface and an outer annular surface of the cup part including a surface of a member with a resistivity which is smaller than that of the main body. It is thereby possible to prevent electric discharge from occurring on the substrate due to induction charging of the substrate.

Still another preferred substrate processing apparatus comprises a holding part for holding a substrate; a processing liquid applying part for applying pure water, which is one type of processing liquid, onto the substrate; a cup part which is formed of electrical insulation material and surrounds the holding part to receive processing liquid splashed from the substrate, liquid including water being held on at least one surface of an inner annular surface and an outer annular surface of the cup part; and a ground part for substantially electrically grounding the liquid held on at least one surface. In such a substrate processing apparatus, it is possible to further suppress the charged potential of the cup part.

A substrate processing apparatus according to an aspect of the present invention comprises a holding part for holding a substrate; a processing liquid applying part for applying pure water, which is one type of processing liquid, onto the substrate; and at least one cup part each of which is formed of electrical insulation material and surrounds the holding part to receive processing liquid splashed from the substrate, and in the apparatus, liquid including water is held on an outer annular surface of an outermost cup part out of at least one cup part. It is thereby possible to suppress the charged potential of the cup part without affecting a process.

A substrate processing apparatus according to another aspect of the present invention comprises a holding part for holding a substrate; a processing liquid applying part for applying pure water, which is one type of processing liquid, onto the substrate; at least one cup part each of which is formed of electrical insulation material or semiconductor material and surrounds the holding part to receive processing liquid splashed from the substrate; and a cylindrical member which is provided close to an outer annular surface of an outermost cup part out of at least one cup part, the cylindrical member having a resistivity which is smaller than that of the outermost cup part. It is therefore possible to suppress the charged potential of the cup part generated in splashing of pure water, with using the cylindrical member.

A substrate processing apparatus according to still another aspect of the present invention comprises a holding part for holding a substrate; a processing liquid applying part for applying pure water, which is one type of processing liquid, onto the substrate; and a cup part whose main body is formed of electrical insulation material, the cup part having an annular sidewall surrounding the holding part to receive processing liquid splashed from the substrate, an auxiliary dielectric material with a dielectric constant, which is higher than that of the electrical insulation material, being provided as an internal portion of the annular sidewall or being provided on a surface of the annular sidewall. In the substrate processing apparatus, it is possible to suppress the charged potential of the cup part generated in splashing of pure water, with using the auxiliary dielectric material. As a result, it is thereby possible to prevent electric discharge from occurring on the substrate due to induction charging of the substrate.

The present invention is also intended for a substrate processing method of processing a substrate by applying processing liquid onto the substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
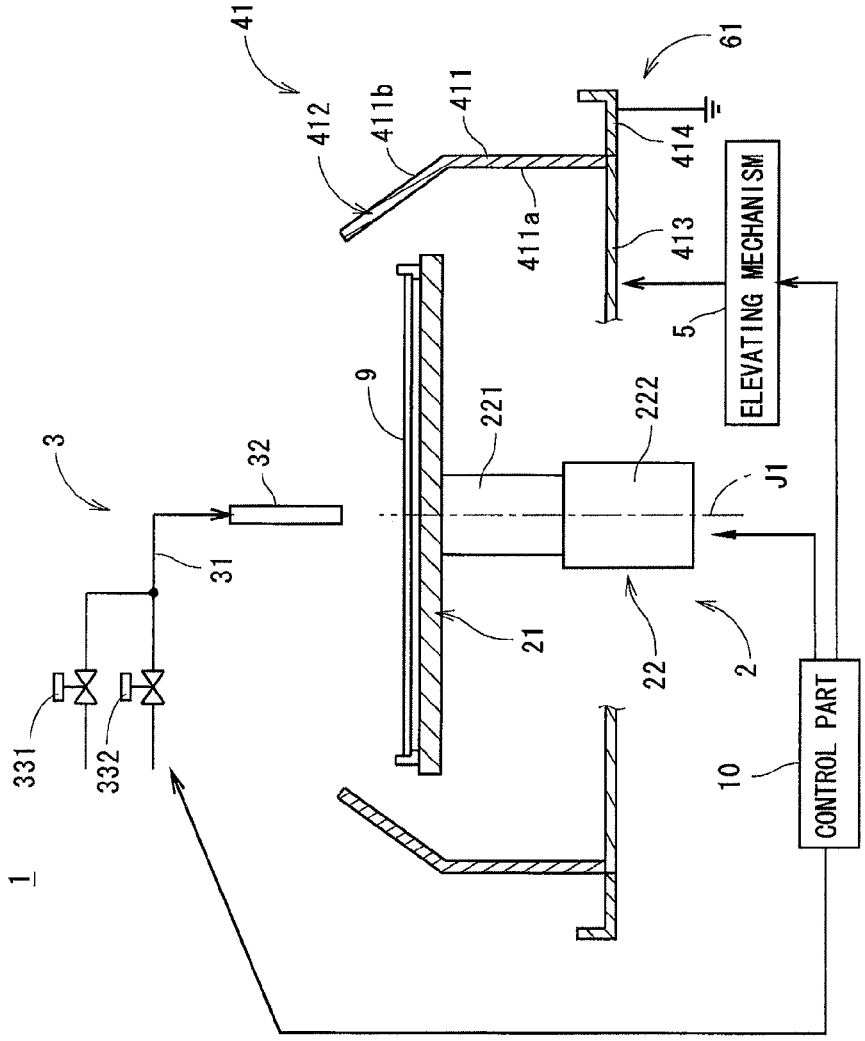
FIG. 1 is a view showing a construction of a substrate processing apparatus in accordance with a first preferred embodiment.

FIG. 1 is a view showing a construction of a substrate processing apparatus 1 in accordance with the first preferred embodiment of the present invention. The substrate processing apparatus 1 is an apparatus for performing processings such as etching which is performed by applying processing liquid onto a semiconductor substrate 9 (for example, a silicon substrate, and hereinafter simply referred to as "substrate 9") on which an insulating film (e.g., an oxide film) is formed.

As shown in FIG. 1, the substrate processing apparatus 1 has a substrate holding part 2 for holding the substrate 9 in contact with a lower main surface of the substrate 9, a processing liquid applying part 3 which is positioned above the substrate 9 to eject cleaning liquid onto an upper main surface of the substrate 9 (hereinafter, referred to as "upper surface"), a cup part 41 surrounding the substrate holding part 2, an elevating mechanism 5 which is a cylinder mechanism for moving the cup part 41 in the up and down direction (the vertical direction) in FIG. 1, and a control part 10 for controlling these constituent elements. In FIG. 1, a part of the substrate holding part 2 is shown cross-sectionally for convenience of illustration (same as in FIGS. 3 to 7, 9, 12, 13, and 15 to 24).

The substrate holding part 2 has a chuck 21 for holding the approximately disk-shaped substrate 9 in contact with the lower main surface and the periphery of the substrate 9 and a rotation mechanism 22 for rotating the substrate 9 together with the chuck 21. The rotation mechanism 22 includes a shaft 221 coupled to the lower surface of the chuck 21 and a motor 222 for rotating the shaft 221. By driving the motor 222, the substrate 9 rotates together with the shaft 221 and the chuck 21 around the central axis J1 which is parallel to a normal direction of the substrate 9 (i.e., the vertical direction to the main surface of the substrate 9) with passing through the center of the substrate 9.

The processing liquid applying part 3 has an ejection part 32 connected to a supply pipe 31. The supply pipe 31 is branched off into two pipes on a side which is opposite to the ejection part 32. One pipe is connected to a supply source of pure water with interposing a pure water valve 331 and the other is connected to a supply source of predetermined (chemical) solution with interposing the solution valve 332. In the processing liquid applying part 3, pure water or (diluted) solution, which is one type of processing liquid, is applied onto the substrate 9 from the ejection part 32 by opening the pure water valve 331 or the solution valve 332. The solution ejected from the ejection part 32 is liquid containing water and has conductivity.

The cup part 41 has an annular sidewall 411 which is arranged around the chuck 21 to prevent the processing liquid applied onto the substrate 9 from being splashed around the annular side wall 411, and an upper portion of the annular sidewall 411 is an inclined part 412 whose diameter decreases toward the processing liquid applying part 3 (i.e., upwards). In the preferred embodiment, the annular sidewall 411 is formed of fluorine resin such as Teflon (trademark) or vinyl chloride resin, an inner annular surface 411a of the annular sidewall 411 has water repellency (hydrophobicity), and an outer annular surface 411b of the annular sidewall 411 has hydrophilicity by hydrophilic treatment such as a plasma treatment or an ozone treatment. Hydrophilicity (wettability) of the outer annular surface 411b may be enhanced by increasing its roughness, depending on material of the cup part 41.

A ring-shaped bottom part 413, which protrudes toward of the central axis J1 and covers the lower space of the chuck 21, is attached to a lower end portion of the annular sidewall 411, and a drain outlet (not shown) for draining the cleaning liquid is provided in the bottom part 413. An auxiliary drain part 414, which spreads on a side opposite to the side of the bottom part 413 in a ring shape, is formed on the lower end portion of the annular sidewall 411 and a top end of the auxiliary drain part 414 bends upwards. As discussed later, water applied to the outer annular surface 411b of the annular sidewall 411 is drained through the auxiliary drain part 414. The auxiliary drain part 414 is formed of conductive material and grounded by the ground part 61 at a position apart from the cup part 41.

Next discussion will be made on an operation flow of the substrate processing apparatus 1 for processing a substrate by applying the processing liquid onto the substrate with reference to FIG. 2. In the substrate processing apparatus 1, a process using a unnecessary substrate (so-called dummy substrate) is performed as preparation for an actual process of the substrate 9. First, the cup part 41 is moved down by the elevating mechanism 5 until an upper end portion of the cup part 41 is positioned below the chuck 21, the dummy substrate is placed on the chuck 21 by an external carrying mechanism, and held by the substrate holding part 2.

Figure 2:
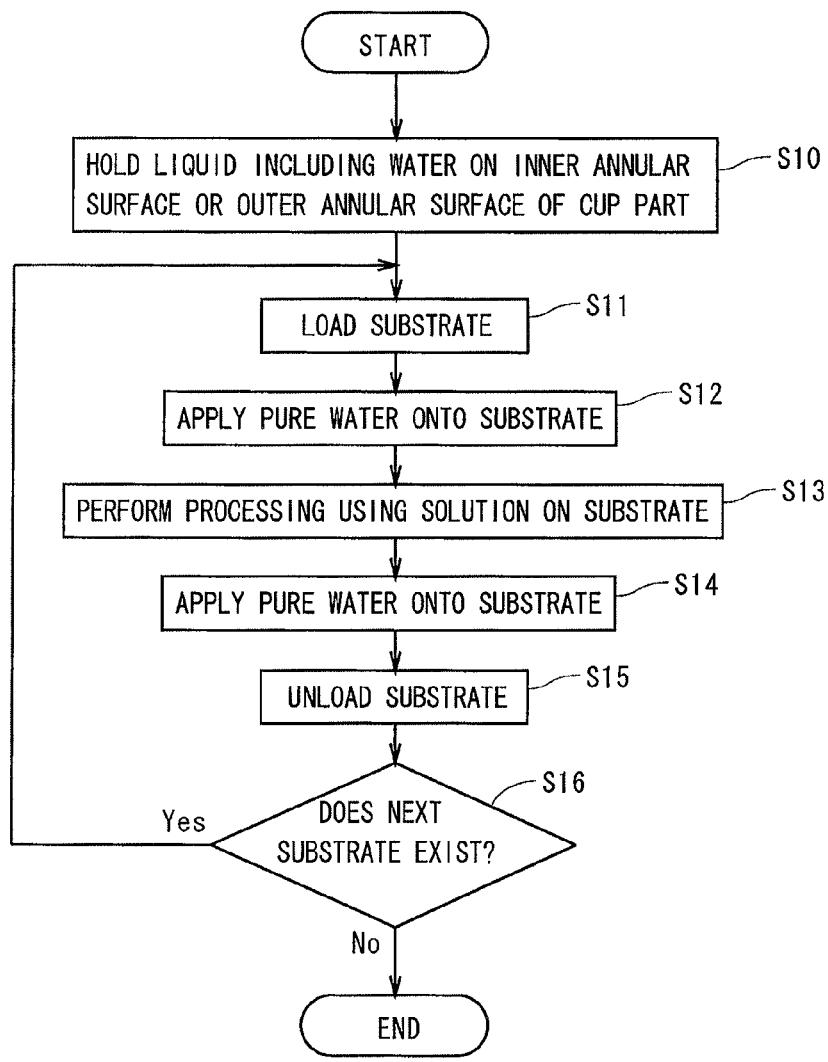
FIG. 2 is a flowchart showing an operation flow of the substrate processing apparatus for processing a substrate.
Figure 3:
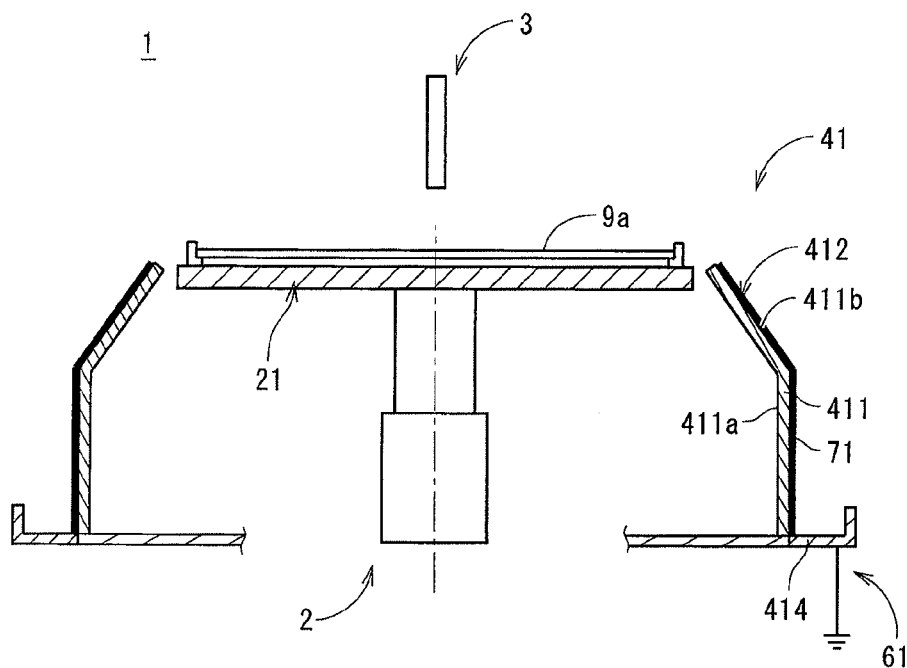
FIG. 3 is a view for explaining an operation for applying pure water to an outer annular surface of a cup part.

FIG. 3 is a view showing the substrate processing apparatus 1 immediately after the dummy substrate 9a is held by the substrate holding part 2. After holding the dummy substrate 9a, pure water is applied onto an upper surface of the dummy substrate 9a by opening the pure water valve 331 (see FIG. 1) in the processing liquid applying part 3 and rotation of the dummy substrate 9a is started by the substrate holding part 2. In this time, the pure water which is applied from the processing liquid applying part 3 and is splashed from the rotating dummy substrate 9a adheres on the outer annular surface 411b of the inclined part 412 in the cup part 41. Since the hydrophilic treatment is performed on the outer annular surface 411b as discussed above, the pure water applied to the inclined part 412 spreads along the outer annular surface 411b and is held on the outer annular surface 411b, to form a thin water layer (i.e., a water film shown by a thick line 71 in FIG. 3) on the outer annular surface 411b of the annular sidewall 411 (Step S10). As discussed later, there is a case where water or other liquid is held on the inner annular surface of the cup part and therefore, Step S10 in FIG. 2 represents the content of a generalized process.

The redundant water splashed from the dummy substrate 9a reaches the auxiliary drain part 414 along the outer annular surface 411b to be drained through the auxiliary drain part 414. Actually, since the substrate processing apparatus 1 is surrounded with a dedicated cover, there is no problem about the pure water splashed outside the cup part 41 (the same as in substrate processing apparatuses 1, 1a and 1b in FIGS. 4, 13 and 20 which are discussed later).

In this time, since carbon dioxide ($CO_2$) and the like in air dissolve into the water layer 71 on the outer annular surface 411b, the water layer 71 has a resistivity which is sufficiently smaller than that of the annular sidewall 411 formed of electrical insulation material. In other words, a surface layer becoming conductive is formed on the outer annular surface 411b in the cup part 41. The water layer 71 is continuously formed to the auxiliary drain part 414 and it is substantially electrically grounded by the ground part 61 with interposing the auxiliary drain part 414.

After the pure water is applied to the outer annular surface 411b for a predetermined time period with rotation of the dummy substrate 9a, the pure water valve 331 in FIG. 1 is closed to stop ejection of pure water, and rotation of the dummy substrate 9a is stopped. After the dummy substrate 9a is taken out by the external carrying mechanism, a substrate 9 to be processed is placed on the chuck 21 and held by the substrate holding part 2 (that is to say, the substrate 9 is loaded) (Step S11). Subsequently, the cup part 41 moves up to put the chuck 21 in the cup part 41. Rotation of the substrate 9 is started by the substrate holding part 2, pure water is applied onto the upper surface of the substrate 9 by opening the pure water valve 331 in the processing liquid applying part 3, and thereby pre-rinse using pure water is performed on the substrate 9 (Step S12). In this time, the pure water which is applied from the processing liquid applying part 3 and is splashed from the rotated substrate 9 is received by the inner annular surface 411a of the cup part 41, to cause frictional charging in the inner annular surface 411a of the cup part 41. In the substrate processing apparatus 1, however, since a charge capacity (electrical capacitance) of the annular sidewall 411 becomes large by forming the water layer 71 (see FIG. 3) which is the surface layer becoming conductive, a charged potential (relative to a ground potential) of the inner annular surface 411a is not greatly increased (i.e., a charged potential of the cup part 41 is further suppressed than that in a case where the water layer 71 is not formed on the outer annular surface 411b). Therefore, the substrate 9 placed on the chuck 21 is hardly charged by induction.

Next, the pure water valve 331 is closed in the processing liquid applying part 3 and the processing liquid applied onto the upper surface of the substrate 9 is switched from the pure water to the solution by opening the solution valve 332 (Step S13). Application of the solution onto the substrate 9 is continued for a predetermined time period to perform a processing using the solution on the substrate 9. Similarly to the case of application of pure water, the solution which is applied from the processing liquid applying part 3 and is splashed from the rotating substrate 9 is received by the inner annular surface 411a of the cup part 41 and drained from the drain outlet in the bottom part 413.

After the solution is applied onto the substrate 9 for the predetermined time period, the solution valve 332 is closed, and the pure water valve 331 is opened. Thus, the processing liquid applied onto the upper surface of the substrate 9 is switched from the solution to the pure water. Subsequently, the upper end portion of the cup part 41 (an end portion of the inclined part 412) moves below the chuck 21 by the elevating mechanism 5 (see FIG. 3), and therefore post-rinse using pure water is performed on the substrate 9 (Step S14). In this time, the pure water which is applied from the processing liquid applying part 3 and is splashed from the rotating substrate 9 adheres on the outer annular surface 411b in the inclined part 412 of the annular sidewall 411. As described above, since the upper end portion of the cup part 41 is positioned below the substrate 9 while the pure water is ejected from the processing liquid applying part 3 in the post-rinse of the substrate 9, the pure water splashed from the substrate 9 is easily and efficiently applied to the outer annular surface 411b of the cup part 41. Therefore, even if the water layer 71 on the outer annular surface 411b of the cup part 41 is dried to partly disappear, since the pure water is resupplied on the outer annular surface 411b, the water layer 71 can be repaired.

After completion of the post-rinse for the substrate 9 using the pure water, ejection of pure water is stopped and rotation of the substrate 9 is stopped. After the substrate 9 is taken out by the external carrying mechanism (that is to say, after the substrate 9 is unloaded) (Step S15), the next substrate 9 to be processed is placed on the chuck 21 and held by the substrate holding part 2 (Steps S16, S11). Then, the pre-rinse of the substrate 9 using the pure water (Step S12), the processing of the substrate 9 using the solution (Step S13), and the post-rinse of the substrate 9 using the pure water (Step S14) are performed similarly to the above operation. In this time, since the pure water is applied to the outer annular surface 411b of the cup part 41 while the preceding substrate 9 which is processed before the in-process substrate 9 is held by the substrate holding part 2, it is possible to surely suppress the charged potential of the cup part 41. After completion of the post-rinse for the substrate 9, the substrate 9 is unloaded (Step S15).

After the processes in the above Steps S11 to S15 are repeated for each of a desired number of substrates 9 (Step S16), operations in the substrate processing apparatus 1 are completed.

As discussed above, the cup part 41 which receives the processing liquid splashed from the substrate 9 by surrounding the substrate holding part 2 is formed of electrical insulation material in the substrate processing apparatus 1 of single wafer type shown in FIG. 1, and water is held in the outer annular surface 411b of the cup part 41 in processing of the substrate 9. With this structure, it is possible to suppress the charged potential of the cup part 41 generated in splashing of the pure water, without greatly increasing the manufacturing cost of the substrate processing apparatus 1 by forming the whole cup part with special conductive material. As a result, it is possible to prevent electric discharge from occurring on the substrate 9 due to induction charging of the substrate 9, in application of the processing liquid onto the substrate 9.

In the cup part 41, water can be easily hold in the outer annular surface 411b by only performing the hydrophilic treatment on the outer annular surface 411b and the surface layer with a resistivity, which is smaller than that of the annular sidewall 411, can be easily formed on the outer annular surface 411b without providing an additional expensive part. Since the water layer 71 is substantially electrically grounded in a state where water is held in the cup part 41, it is possible to further suppress the charged potential of the cup part 41.

Figure 4:
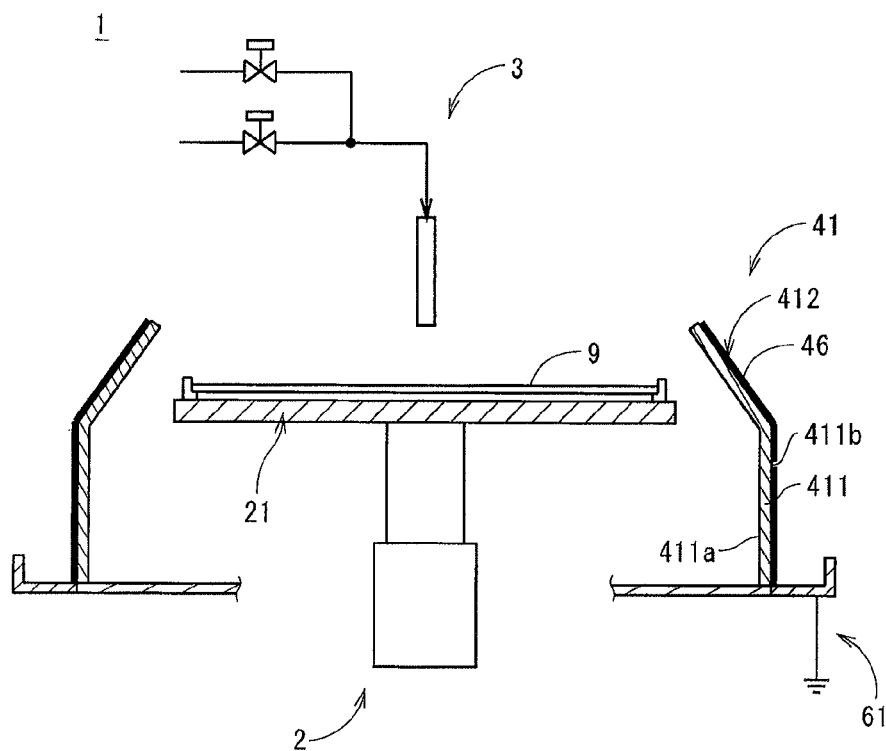
FIG. 4 is a view showing another example of the substrate processing apparatus.

FIG. 4 is a view showing another example of the substrate processing apparatus 1 which suppresses the charged potential by forming a water layer in the cup part. The cup part 41 of the substrate processing apparatus 1 in FIG. 4 is different from that in FIG. 1 in that the hydrophilic treatment performed on the outer annular surface 411b of the annular sidewall 411 is omitted and a textile material 46 (shown by a thick line in FIG. 4) is attached along the outer annular surface 411b by bonding.

Similarly to the case of the substrate processing apparatus 1 in FIG. 1, pure water splashed from the rotating substrate 9 is applied to the outer annular surface 411b of the annular sidewall 411 in a state where the upper end portion of the cup part 41 is positioned below the chuck 21, and the pure water penetrates into the textile material 46 to be easily held in the outer annular surface 411b in the substrate processing apparatus 1 in FIG. 4. A resistivity of the pure water which penetrates into the textile material 46 is decreased because $CO_2$ and the like in air dissolve into the pure water, and a surface layer becoming conductive is formed on the outer annular surface 411b of the cup part 41. Water held in the textile material 46 is substantially electrically grounded by the ground part 61. In the substrate processing apparatus 1 of FIG. 4, the charged potential of the cup part 41 generated in splashing of the pure water in processing the substrate 9 is suppressed by the water layer formed on the outer annular surface 411b. As a result, it is possible to prevent electric discharge from occurring on the substrate 9 due to induction charging of the substrate 9, in application of the processing liquid onto the substrate 9.

There may be a case where a mesh member formed of fluorine resin, for example, is provided instead of the textile material 46 in the substrate processing apparatus 1 of FIG. 4 and the charged potential of the cup part 41 generated in splashing of the pure water is suppressed by holding water in the mesh member.

Figure 5:
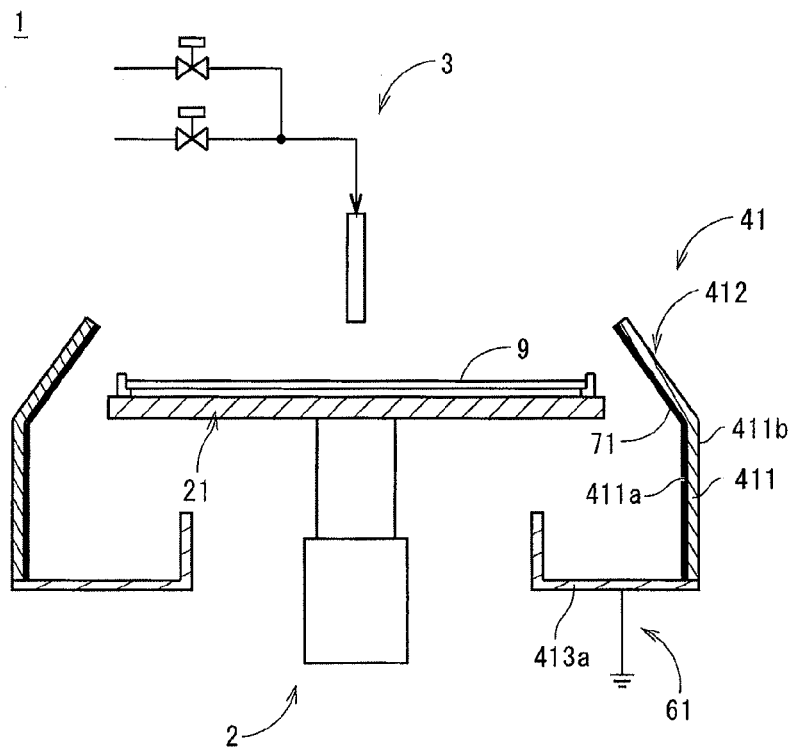
FIGS. 5 to 7 are views each showing still another example of the substrate processing apparatus.

FIG. 5 is a view showing still another example of the substrate processing apparatus 1 which suppresses the charged potential by forming a water layer in the cup part. In the cup part 41 of the substrate processing apparatus 1 in FIG. 5, the hydrophilic treatment is performed on the inner annular surface 411a of the annular sidewall 411 instead of the outer annular surface 411b. A bottom part 413a of the cup part 41 spreads inside from the lower end portion of the annular sidewall 411 in a ring shape and the top end of the bottom part 413a bends upwards. The bottom part 413a is formed of conductive material having corrosion resistance against the processing liquid and connected to the ground part 61. The other constituent elements are the same as those of the substrate processing apparatus 1 in FIG. 1 and represented by the same reference signs in the following discussion.

When the substrate 9 is processed in the substrate processing apparatus 1 of FIG. 5, in the operation of Step S10 in FIG. 2, pure water is applied onto the upper surface of the dummy substrate and rotation of the dummy substrate is started by the substrate holding part 2 in a state where the chuck 21 holding the dummy substrate is put in the cup part 41 (i.e., pure water is not applied to the outer annular surface 411b of the cup part 41). With this operation, the pure water, which is applied from the processing liquid applying part 3 and is splashed from the rotating dummy substrate, adheres on the inner annular surface 411a in the cup part 41, and a water layer 71 becoming conductive is thereby formed on the inner annular surface 411a. Then, after taking out the dummy substrate, the substrate 9 to be processed is placed on the chuck 21 (Step S11), and the pre-rinse of the substrate 9 using the pure water (Step S12), the processing of the substrate 9 using the solution (Step S13) and the post-rinse of the substrate 9 using the pure water (Step S14) are performed. The post-rinse of the substrate 9 using the pure water in Step S14 is performed in a state where the chuck 21 is kept in the cup part 41.

In the substrate processing apparatus 1 of FIG. 5, since water is held in the inner annular surface 411a of the cup part 41, it is suppressed that frictional charging occurs in the inner annular surface 411a of the cup part 41 by the pure water splashed from the rotating substrate 9 in processing of the substrate 9. Even if the frictional charging occurs, the charged potential of the cup part 41 is surely suppressed by the water layer 71 which is substantially grounded through the ground part 61. As a result, it is possible to prevent electric discharge from occurring on the substrate 9 due to induction charging of the substrate 9, in application of the processing liquid onto the substrate 9. In the substrate processing apparatus 1 of FIG. 5, since a portion formed of conductive material is only a part (the bottom part 413a) of the cup part 41, the manufacturing cost of the cup part 41 is not greatly increased. In the substrate processing apparatus 1 of FIG. 5, there may be a case where a textile material or a mesh member is provided in the inner annular surface 411a of the cup part 41 and water is held in the inner annular surface 411a.

Figure 6:
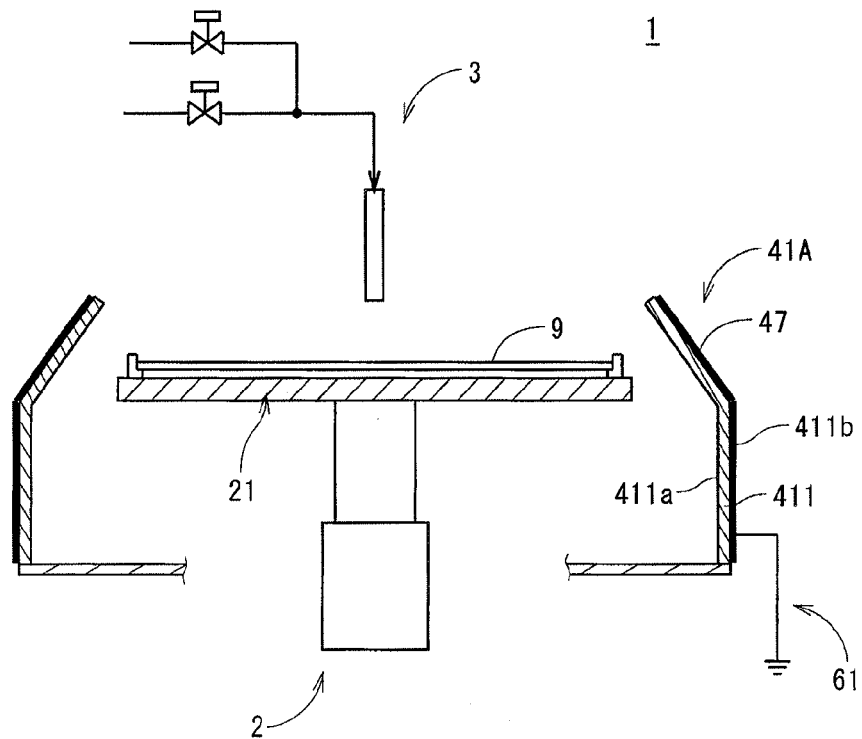

Next discussion will be made on other technique of suppressing the charged potential of the cup part in the substrate processing apparatus 1. FIG. 6 is a view showing still another example of the substrate processing apparatus 1. In a cup part 41A of the substrate processing apparatus 1 of FIG. 6, a conductive resin film 47 (shown by a thick line in FIG. 6) is attached on an outer annular surface of a main body instead of the textile material 46 in the substrate processing apparatus 1 of FIG. 4. With this structure, a whole outer annular surface 411b of the cup part 41A becomes a surface of the conductive resin film 47. A ground part 61 is directly connected to the conductive resin film 47 to electrically ground it. The conductive resin film 47 may be fixed with screws or the like other than bonding, and the conductive resin film may be formed on the outer annular surface of the main body in the cup part 41A by coating.

When the substrate 9 is processed in the substrate processing apparatus 1, the operation of Step S10 in FIG. 2 is omitted and the chuck 21 is kept in the cup part 41A also in the post-rinse of the substrate 9 using the pure water in Step S14 (i.e., the pure water is not applied to the outer annular surface 411b of the cup part 41A).

As discussed above, it is possible to easily provide a member with a resistivity, which is smaller than that of the main body, in the whole circumference of the cup part 41A, only by attaching the conductive resin film 47 on the outer annular surface of the main body in the substrate processing apparatus 1 of FIG. 6. Thus, the charge capacity of the annular sidewall 411 becomes large, and the charged potential of the cup part 41A generated in splashing of the pure water can be suppressed in the whole circumference of the annular sidewall 411 without performing the operation for applying the pure water onto the outer annular surface 411b, thereby preventing electric discharge from occurring on the substrate 9. Since the conductive resin film 47 is electrically grounded in the substrate processing apparatus 1 of FIG. 6, it is possible to further suppress the charged potential of the cup part 41A.

Figure 7:
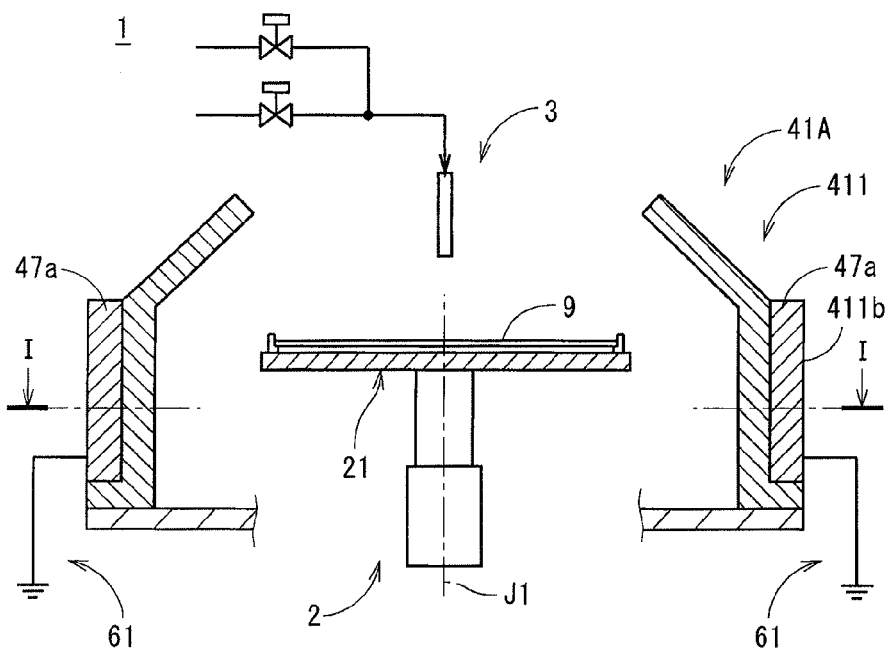
Figure 8:
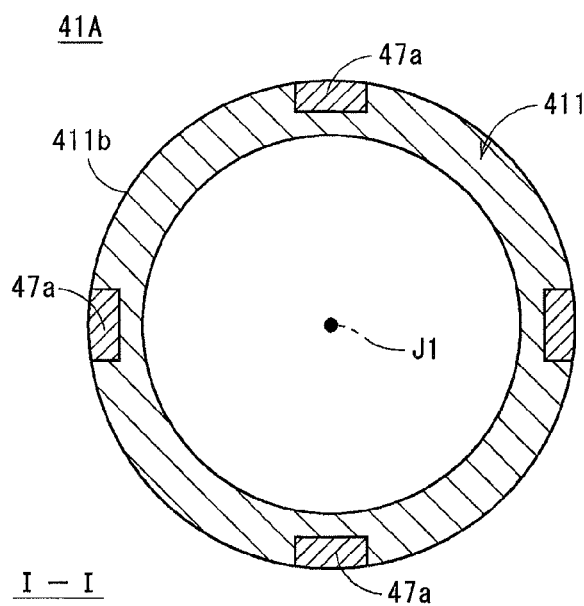
FIG. 8 is a cross-sectional view of a cup part.

FIG. 7 is a view showing still another example of the substrate processing apparatus 1, and FIG. 8 is a cross-sectional view of a cup part 41A at the position indicated by the arrows I-I in FIG. 7. As shown in FIGS. 7 and 8, an annular sidewall 411 of the cup part 41A has a plurality of (four in the example of FIG. 8) conductive members 47a which are formed of conductive resin, conductive carbon (such as glassy carbon) or the like, and a resistivity of the conductive members 47a is made smaller than that of a main body of the cup part 41A formed of electrical insulation material (in the cup part 41A of FIG. 7, the resistivity of the conductive members 47a is made smaller than that of a portion excluding the conductive members 47a in the annular sidewall 411). The plurality of conductive members 47a are arranged in a circumferential direction of the cup part 41A at regular intervals (that is to say, the plurality of conductive members 47a are arranged along a circle around the central axis J1 at equal angle intervals). Actually, the plurality of conductive members 47a are fitted into a plurality of recessed portions, respectively, which are formed on an outer annular surface 411b of the cup part 41A and each extending along the central axis J1 and surfaces of the conductive members 47a, which are opposite to the other surfaces on the side of the central axis J1, are included in the outer annular surface 411b of the annular sidewall 411. Each conductive member 47a is grounded by a ground part 61. As described above, in the case that the outer annular surface 411b partly includes the surfaces of the conductive members 47a with a resistivity which is smaller than that of the main body of the cup part 41, the charge capacity of the annular sidewall 411 becomes large, thereby suppressing the charged potential of the cup part 41A generated in splashing of the pure water.

In the cup parts 41A in FIGS. 6 and 7, since the outer annular surfaces 411b include the surface(s) of the member(s) with a resistivity which is smaller than that of the main body, the charged potential of the cup parts 41A generated in splashing of the pure water can be suppressed to prevent electric discharge from occurring on the substrate 9 due to induction charging of the substrate 9. Also, it is possible to manufacture the cup parts 41A of FIGS. 6 and 7 at low cost in comparison with a case where the whole cup part is formed of special conductive material.

Figure 9:
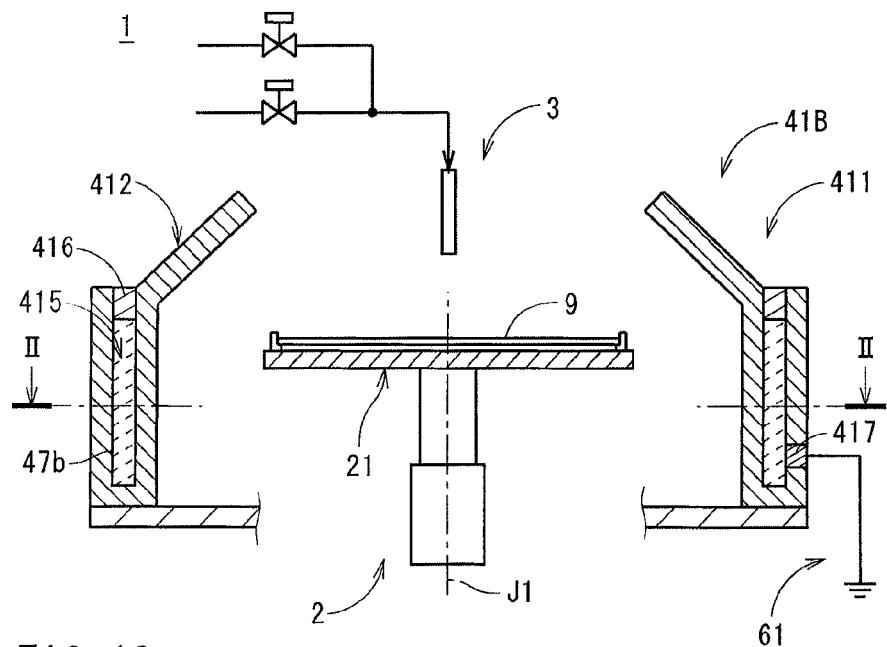
FIG. 9 is a view showing still another example of the substrate processing apparatus.
Figure 10:
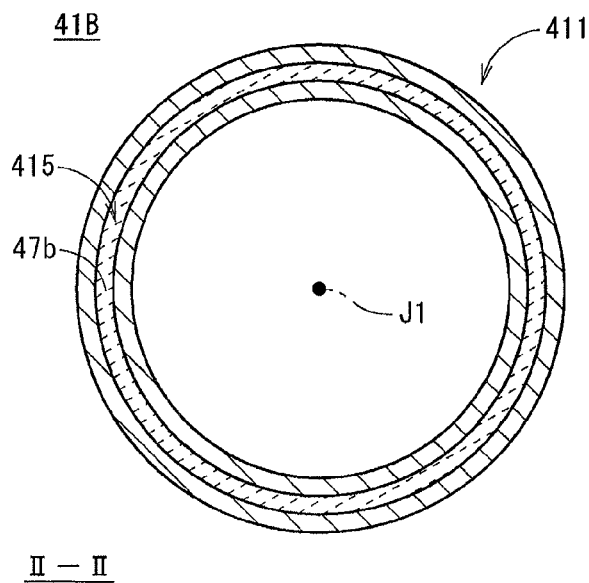
FIG. 10 is a cross-sectional view of a cup part.

Next discussion will be made on still another technique of suppressing the charged potential of the cup part in the substrate processing apparatus 1. FIG. 9 is a view showing still another example of the substrate processing apparatus 1, and FIG. 10 is a cross-sectional view of a cup part 41B at the position indicated by the arrows II-II in FIG. 9. As shown in FIGS. 9 and 10, an annular sidewall 411 of the cup part 41B has a deep ring-shaped groove 415 around the central axis J1, and the ring-shaped groove 415 is filled with a liquid 47b with conductivity, such as water into which $CO_2$ dissolves or liquid where ammonium chloride ($NH_4Cl$) is dissolved into methanol ($CH_3OH$). As discussed later, the liquid 47b is liquid sealed in the annular sidewall 411 and hereinafter referred to as "sealed liquid 47b". As shown in FIG. 9, since an opening of the ring-shaped groove 415 which is on the side of an inclined part 412 is closed by a ring-shaped lid member 416, the sealed liquid 47b is held (sealed) in the annular sidewall 411. In the annular sidewall 411, a part of an outer portion of the ring-shaped groove 415 functions as an electrode part 417 which is formed of conductive material such as conductive resin and the electrode part 417 is connected to a ground part 61, and thus the sealed liquid 47b is substantially grounded.

In the cup part 41B shown in FIGS. 9 and 10, the annular sidewall 411, which surrounds the substrate holding part 2 to receive the processing liquid splashed from the substrate 9, has an internal portion with a resistivity which is smaller than that of the material forming a main body of the cup part 41B as discussed above, and the internal portion extends continuously in a circumferential direction of the annular sidewall 411 (in the cup part 41B of FIG. 9, the main body is a portion excluding the sealed liquid 47b in the annular sidewall 411). With this structure, the charge capacity of the annular sidewall 411 becomes large, and the charged potential of the cup part 41B generated in splashing of the pure water can be suppressed in the whole circumference of the annular sidewall 411, thereby preventing electric discharge from occurring on the substrate 9. Since the sealed liquid 47b is electrically grounded, it is possible to further suppress the charged potential of the cup part 41B. Pure water is normally used in processing the substrate 9, and therefore, the sealed liquid can be easily prepared in a case where water containing dissolved $CO_2$ is used as the sealed liquid.

Figure 11:
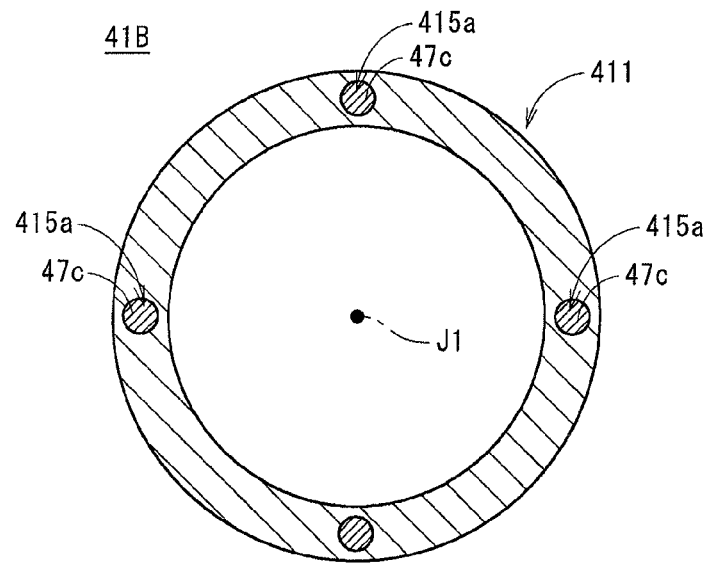
FIG. 11 is a view showing another example of a cup part.

FIG. 11 is a view showing another example of the cup part 41B and is a cross-sectional view of the cup part 41B corresponding to FIG. 10. In the cup part 41B of FIG. 11, a plurality of deep holes 415a in each of which a cross section perpendicular to the central axis J1 is round shape (actually, four holes 415a each of which has an approximately same depth as the ring-shaped groove 415 of FIG. 9) are formed, they are arranged in a circumferential direction of the annular sidewall 411 at regular intervals, and a cylindrical conductive member 47c, being formed of conductive resin, conductive carbon (for example, glassy carbon) or the like, is inserted into each hole 415a. Each conductive member 47c is connected to a ground part 61 (not-shown) through a small hole which is formed outside the conductive member 47c in the annular sidewall 411. As discussed above, in the case that the cup part 41B has an internal portion which is a set of conductive members 47c arranged in the circumferential direction of the annular sidewall 411 as parts of the annular sidewall 411 and the internal portion has a resistivity which is smaller than that of the material forming the main body of the annular sidewall 411, it is possible to suppress the charged potential of the cup part 41B due to the splashed pure water.

Thus, in the cup part 41B in FIGS. 10 and 11, since the annular sidewall 411 has the internal portion with a resistivity which is smaller than that of the material forming the main body of the cup part 41B, the charged potential of the cup part 41B generated in splashing of the pure water can be suppressed to prevent electric discharge from occurring on the substrate 9 due to induction charging of the substrate 9. Also, it is possible to manufacture the cup part 41B of FIGS. 10 and 11 at low cost in comparison with a case where the whole cup part is formed of special conductive material. There may be a case where a ring-shaped conductive member formed of conductive resin, conductive carbon, or the like is inserted into the ring-shaped groove 415 of FIG. 10 and the sealed liquid is sealed in the holes 415a of FIG. 11. Portions of the conductive member and portions of the sealed liquid may be formed in the annular sidewall 411 so that their positions in the circumferential direction are shifted mutually.

Figure 12:
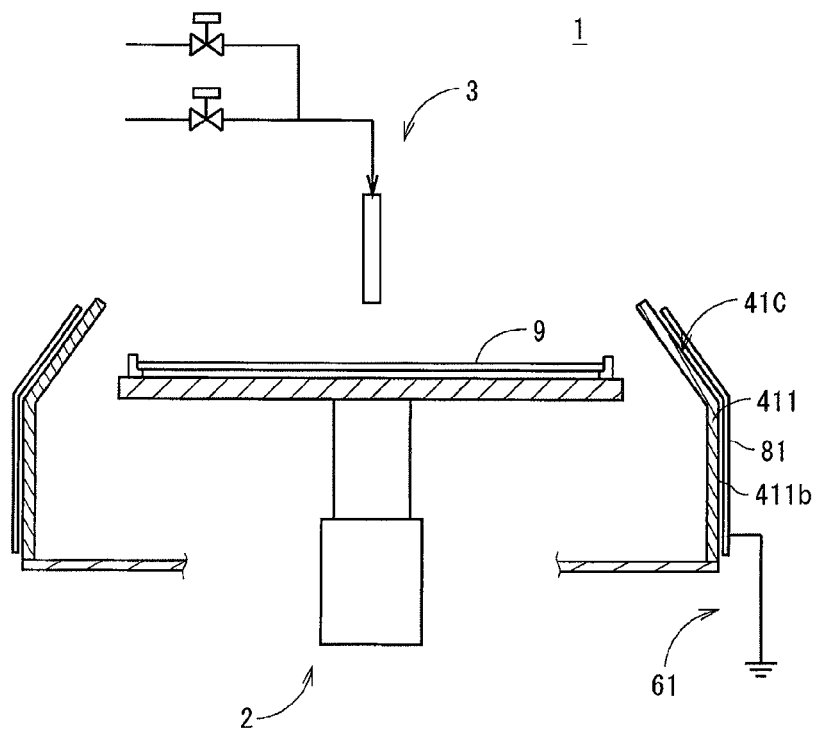
FIG. 12 is a view showing still another example of the substrate processing apparatus.

Next, discussion will be made on still another technique of suppressing the charged potential of the cup part in the substrate processing apparatus 1. FIG. 12 is a view showing still another example of the substrate processing apparatus 1. In the substrate processing apparatus 1 of FIG. 12, an approximately cylindrical member 81 (Hatching of its cross section is omitted in FIG. 12. The same is applied to a cylindrical member 81a of FIG. 23 discussed later.) is provided around an annular sidewall 411 of a cup part 41C. The inner surface of the cylindrical member 81 is along an outer annular surface 411b of the annular sidewall 411 and a small clearance is formed between the inner surface of the cylindrical member 81 and the outer annular surface 411b (for example, the width of the clearance is 1 millimeter (mm) to 10 centimeters (cm)). The cylindrical member 81 is formed of metal such as stainless steel and its surface is coated with fluorine resin, e.g., Teflon (trademark) or the like. Also, the cylindrical member 81 is grounded by a ground part 61.

In the substrate processing apparatus 1 of FIG. 12, since the conductive cylindrical member 81 is provided close to the outer annular surface 411b of the cup part 41C, the charge capacity of the annular sidewall 411 becomes large substantially. For this reason, the charged potential of the cup part 41C generated in splashing of the pure water can be suppressed without greatly increasing the manufacturing cost of the substrate processing apparatus 1 by forming the whole cup part with a special conductive material. As a result, it is possible to prevent electric discharge from occurring on the substrate 9 due to induction charging of the substrate 9. The charged potential of the cup part 41C can be further suppressed by grounding the cylindrical member 81.

In the meantime, it is required to prevent metal impurities from adhering on the substrate 9, for maintaining a constant yield in manufacturing of semiconductor products in processing of the substrate 9 in the substrate processing apparatus 1. Therefore, in order to avoid elution of metal in a cup part, metal cannot be used in an internal portion of a cup part or a surface of the cup part in general design. Conversely, since the cylindrical member 81 is provided away from the cup part 41C in the substrate processing apparatus 1 of FIG. 12, it is possible to form the cup part 41C at low cost by using metal. The above-discussed cylindrical member 81 is coated with fluorine resin to prevent its corrosion. Naturally, the cylindrical member 81 may be formed of conductive resin or conductive carbon.

Figure 13:
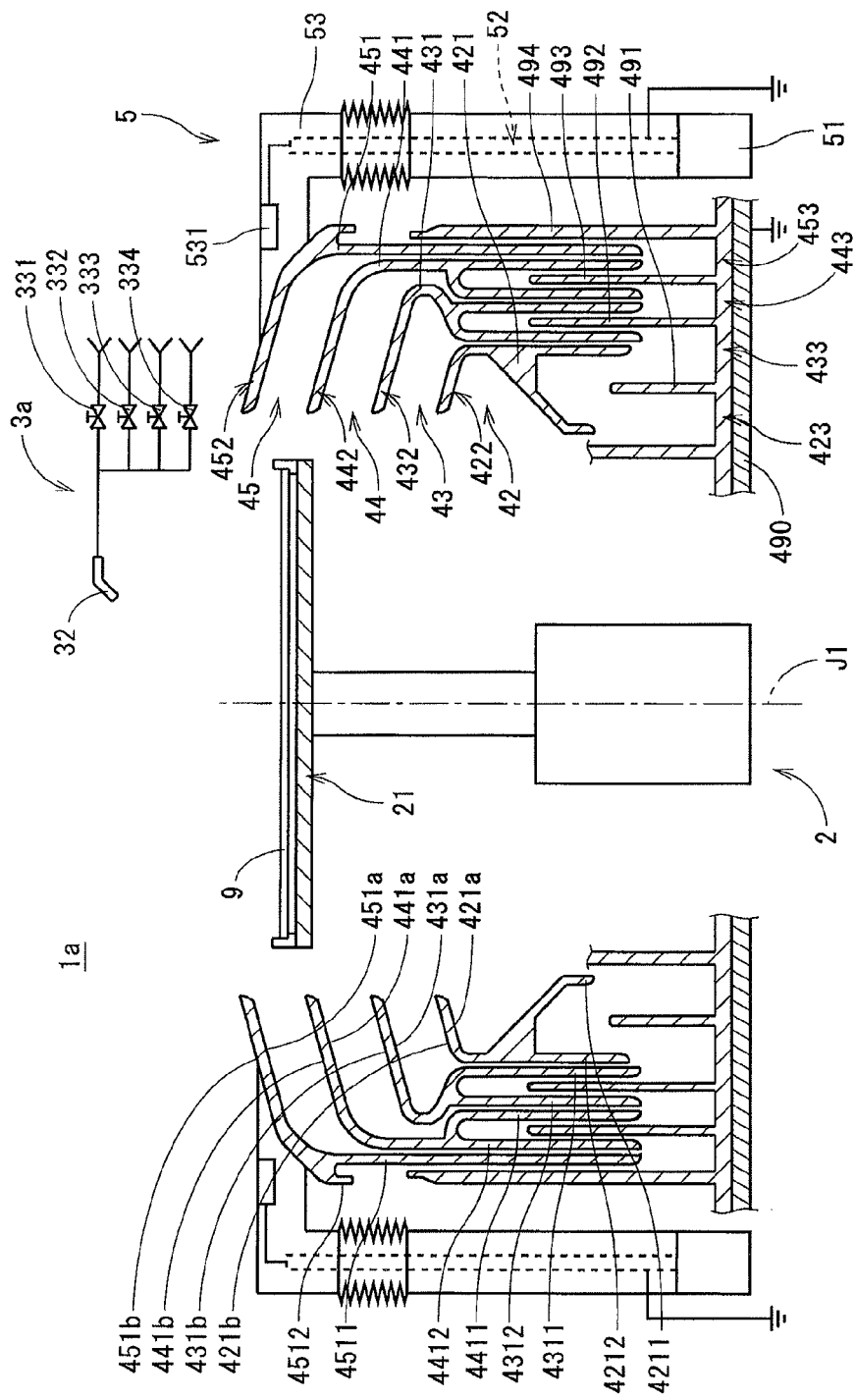
FIG. 13 is a view showing a construction of a substrate processing apparatus in accordance with a second preferred embodiment.

FIG. 13 is a view showing a construction of a substrate processing apparatus 1a in accordance with the second preferred embodiment of the present invention. In the substrate processing apparatus 1a of FIG. 13, a plurality of cup parts 42 to 45 are arranged concentrically and a plurality of kinds of solution can be ejected from a processing liquid applying part 3a. An elevating mechanism 5 of the substrate processing apparatus 1a has a motor 51 and a ball screw mechanism 52, and the elevating mechanism 5 can move the cup parts 42 to 45 relatively to a substrate holding part 2 in a direction along the central axis J1 as a unit. Constituent elements of the substrate holding part 2 are the same as those in the substrate processing apparatus 1 of FIG. 1, and a control part is not shown in the substrate processing apparatus 1a of FIG. 13 (the same as in a substrate processing apparatus 1b of FIG. 20 discussed later).

In respective cup parts 42 to 45, annular sidewalls 421, 431, 441, 451 and bottom parts 423, 433, 443, 453 are provided separately and the plurality of bottom parts 423, 433, 443, 453 are formed as a unit. In detail, the plurality of bottom parts 423, 433, 443, 453 formed of electrical insulation material are arranged in a ring shape around the central axis J1. A conductive plate 490 which is grounded is provided in contact with lower surfaces of the plurality of bottom parts 423, 433, 443, 453 (the lower surfaces are surfaces opposite to the upper surfaces facing the processing liquid applying part 3a). Cylindrical partitions 491, 492, 493, 494, which protrude toward the processing liquid applying part 3a (i.e., upwards) around the central axis J1, are respectively arranged in a border between the bottom parts 423 and 433, a border between the bottom parts 433 and 443, a border between the bottom parts 443 and 453, and a border outside of the bottom part 453. A lower portion of each of the annular sidewalls 421, 431, 441, 451 is divided into an inner cylindrical part 4211, 4311, 4411, 4511 and an outer cylindrical part 4212, 4312, 4412, 4512 (see reference signs on the left side of FIG. 13), so that it is provided over the partition 491, 492, 493, 494. Upper portions of the annular sidewalls 421, 431, 441, 451 are inclined parts 422, 432, 442, 452 each of which has a diameter which decreases toward the processing liquid applying part 3a. The cup part 45 is located outermost, the cup part 44 is located inside the cup part 45, the cup part 43 is located inside the cup part 44, and then the cup part 42 is located inside the cup part 43. A distance between the processing liquid applying part 3a and the inclined part 422, 432 or 442 of the cup part 42, 43 or 44 is longer than that between the processing liquid applying part 3a and the inclined part 432, 442 or 452 of the cup part 43, 44 or 45 (i.e., the inner the cup part is located, the longer a distance between the processing liquid applying part 3a and the cup part is.).

Each of the annular sidewalls 421, 431, 441, 451 is formed of electrical insulation material, and the same hydrophilic treatment is performed on their inner annular surfaces 421a, 431a, 441a, 451a and their outer annular surfaces 421b, 431b, 441b, 451b (see reference signs on the left side of FIG. 13). In the lower portions of the annular sidewalls 421, 431, 441, 451, inner surfaces of the inner cylindrical parts 4211, 4311, 4411, 4511 are regarded as parts of the inner annular surfaces 421a, 431a, 441a, 451a, and outer surfaces of the outer cylindrical parts 4212, 4312, 4412, 4512 are regarded as parts of the outer annular surfaces 421b, 431b, 441b, 451b in the following description.

The elevating mechanism 5 has a supporting member 53 which is formed of the same electrical insulation material as the cup parts 42 to 45, and an end portion of the supporting member 53 is connected to the annular sidewall 451 of the outer cup part 45 (hereinafter, also referred to as "outermost cup part 45"). The annular sidewalls 421, 431, 441, 451 of the plurality of cup parts 42 to 45 are partly connected one another. By driving the motor 51, the plurality of annular sidewalls 421, 431, 441, 451 is moved up and down relatively to the substrate holding part 2 in the direction along the central axis J1 as a unit with use of the supporting member 53. The supporting member 53 is provided with a conductive sheet 531 which is grounded through the ball screw mechanism 52, and the same hydrophilic treatment as the cup parts 42 to 45 is also performed on a surface of the supporting member 53.

The processing liquid applying part 3a has four valves 331 to 334. Pure water is ejected from an ejection part 32 by opening a pure water valve 331, first solution is ejected from the ejection part 32 by opening a first solution valve 332, second solution is ejected from the ejection part 32 by opening the second solution valve 333, and then third solution is ejected from the ejection part 32 by opening a third solution valve 334. The first to third solution have conductivity and are liquid including water.

Figure 14:
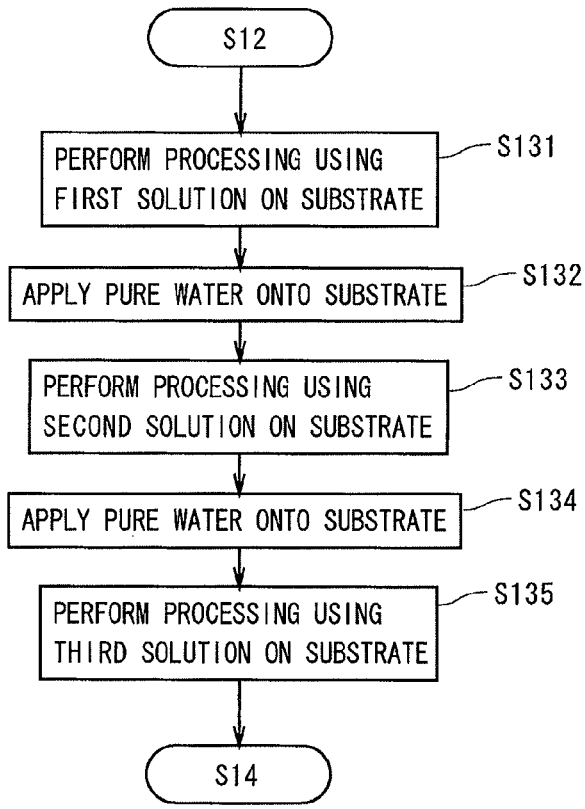
FIG. 14 is a flowchart showing a part of an operation flow of the substrate processing apparatus for processing a substrate.

FIG. 14 is a flow chart showing a part of an operation flow of the substrate processing apparatus 1a for processing a substrate by applying processing liquid onto the substrate and shows the operation in Step S13 of FIG. 2. Discussion will be made on a basic operation of the substrate processing apparatus 1a at first, with reference to Steps S11 to S16 of FIG. 2 and FIG. 14.

Figure 15:
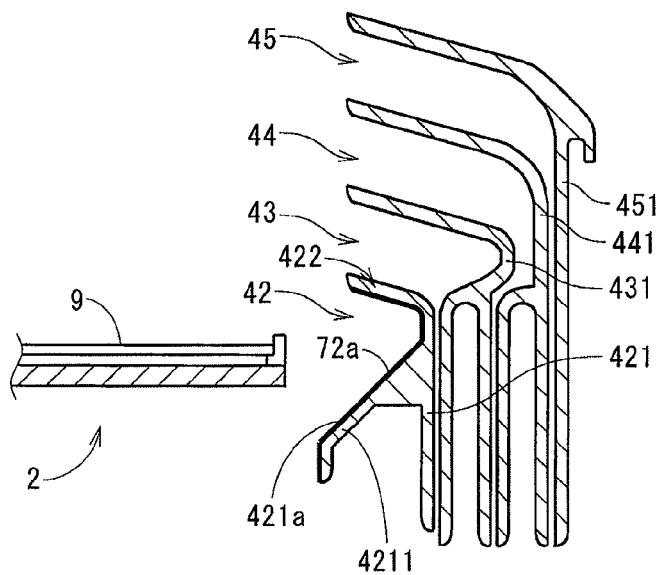
FIGS. 15 to 17 are views each for explaining a basic operation of the substrate processing apparatus.

In the basic operation of the substrate processing apparatus 1a in FIG. 13, first, a substrate 9 is placed on a chuck 21 and held by the substrate holding part 2 (FIG. 2: Step S11), and the cup parts 42 to 45 move upwards by the elevating mechanism 5 and the substrate 9 is disposed in a position (hereinafter, referred to as "pre-rinse position") between the inclined part 422 of the innermost annular sidewall 421 and the inner cylindrical part 4211 as shown in FIG. 15. Rotation of the substrate 9 is started and pure water is applied onto the substrate 9 from the processing liquid applying part 3a (see FIG. 1), to perform pre-rinse of the substrate 9 using pure water (Step S12). In this time, pure water splashed from the rotating substrate 9 is received by the inner annular surface 421a of the annular sidewall 421 in the cup part 42. The redundant pure water is drained from a drain outlet provided in the bottom part 423.

Figure 16:
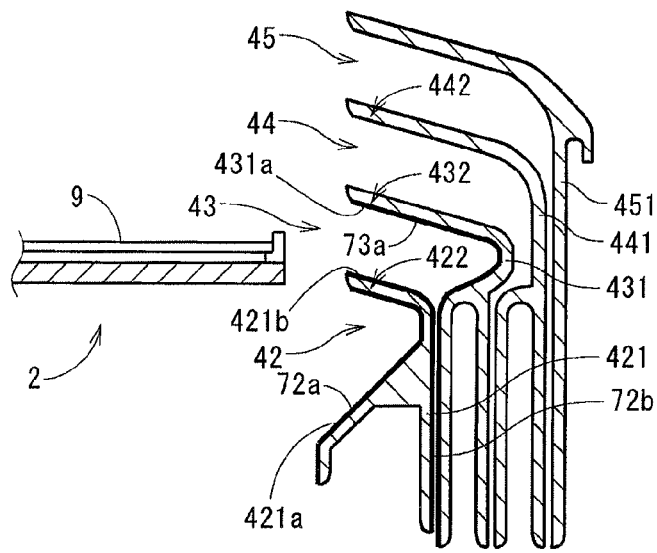

After a predetermined time period has passed from a starting time of applying pure water, ejection of pure water is stopped in the processing liquid applying part 3a, the cup parts 42 to 45 move downwards, and then the substrate 9 is disposed in a position between the inclined part 432 of the second innermost annular sidewall 431 and the inclined part 422 of the innermost annular sidewall 421 as shown in FIG. 16. Rotation of the substrate 9 is kept while the substrate 9 moves up and down but may be temporally stopped in the substrate processing apparatus 1a.

Ejection of the first solution is started by the processing liquid applying part 3a and processing with the first solution is performed on the substrate 9 (FIG. 14: Step S131). In this time, most of the first solution splashed from the rotating substrate 9 is received by the inner annular surface 431a of the annular sidewall 431 in the cup part 43, and the first solution dripped from the inner annular surface 431a and a part of the first solution splashed from the substrate 9 also adhere on the outer annular surface 421b of the innermost annular sidewall 421. The redundant first solution is collected from a collection outlet provided in the bottom part 433 and it is reused (the same as in the second and third solutions which are discussed later).

After a predetermined time period has passed from start of ejection of the first solution, ejection of the first solution from the processing liquid applying part 3a is stopped, the cup parts 42 to 45 move upwards by the elevating mechanism 5, and then the substrate 9 is returned to the pre-rinse position shown in FIG. 15. Subsequently, application of pure water onto the substrate 9 is started and the first solution existing on the substrate 9 is removed by pure water (Step S132). After ejection of pure water from the ejection part 32 is continued for a predetermined time period, it is stopped and the elevating mechanism 5 moves the substrate 9 up to a position between the inclined part 442 of the annular sidewall 441 and the inclined part 432 of the annular sidewall 431. Ejection of the second solution is started and processing with the second solution is performed on the substrate 9 (Step S133). In this time, most of the second solution splashed from the rotating substrate 9 is received by the inner annular surface 441a of the annular sidewall 441 in the cup part 44 (see FIG. 13). The second solution dripped from the inner annular surface 441a and a part of the second solution splashed from the substrate 9 also adhere on the outer annular surface 431b of the inner annular sidewall 431.

After a predetermined time period has passed from start of ejection of the second solution, ejection of the second solution from the processing liquid applying part 3a is stopped. The substrate 9 is returned to the pre-rinse position and application of pure water onto the substrate 9 is performed for a predetermined time period, to remove the second solution existing on the substrate 9 by pure water (Step S134). Subsequently, application of pure water is stopped and the substrate 9 is disposed in a position between the inclined part 452 of the annular sidewall 451 and the inclined part 442 of the annular sidewall 441. Ejection of the third solution is started and processing with the third solution is performed on the substrate 9 (Step S135). In this time, most of the third solution splashed from the rotating substrate 9 is received by the inner annular surface 451a of the annular sidewall 451 in the outermost cup part 45. The third solution dripped from the inner annular surface 451a and a part of the third solution splashed from the substrate 9 also adhere on the outer annular surface 441b of the annular sidewall 441.

Figure 17:
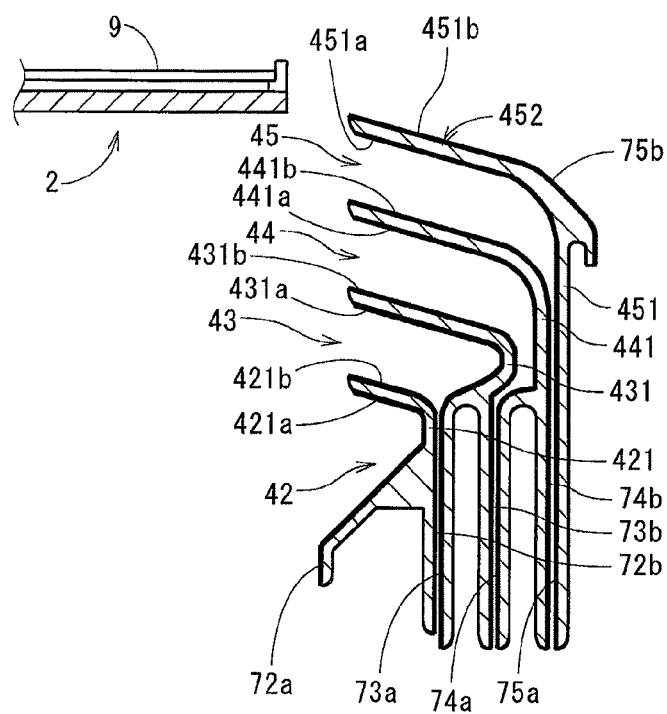

After a predetermined time period has passed from start of ejection of the third solution, ejection of the third solution from the processing liquid applying part 3a is stopped, the cup parts 42 to 45 move downwards and an upper end portion of the annular sidewall 451 is positioned below the substrate 9 as shown in FIG. 17. Then, pure water is ejected onto the substrate 9 from the ejection part 32 and the post-rinse of the substrate 9 is performed with the pure water (FIG. 2: Step S14). In this time, the pure water splashed from the rotating substrate 9 is applied to the outer annular surface 451b of the inclined part 452 in the annular sidewall 451. After completing the post-rinse of the substrate 9, the substrate 9 is unloaded (Step S15) and the next substrate 9 to be processed is loaded in the substrate processing apparatus 1a (Steps S16, S11).

As preparation for the actual operation in the substrate processing apparatus 1a, first, a dummy substrate is loaded, the same operations as the above Steps S12 to S14 are performed, and liquid including water is held on the inner annular surfaces and the outer annular surfaces of the cup parts 42 to 45 (Step S10). Specifically, in the operation corresponding to Step S12 (and Steps S132, S134), pure water splashed from the rotating dummy substrate is received by the inner annular surface 421a of the annular sidewall 421 to form a water layer (shown by a thick line 72a in FIGS. 15 and 17) on the inner annular surface 421a of the cup part 42. In the operation corresponding to Step S131, the first solution splashed from the rotating dummy substrate is received by the inner annular surface 431a of the annular sidewall 431 and also adheres on the outer annular surface 421b of the annular sidewall 421, to form first solution layers (shown by thick lines 73a, 72b in FIGS. 16 and 17) on the inner annular surface 431a of the cup part 43 and the outer annular surface 421b of the cup part 42, respectively. Also, in the operation corresponding to Step S133, the second solution splashed from the rotating dummy substrate is received by the inner annular surface 441a of the annular sidewall 441 and also adheres on the outer annular surface 431b of the annular sidewall 431, to form second solution layers (shown by thick lines 74a, 73b in FIG. 17) on the inner annular surface 441a of the cup part 44 and the outer annular surface 431b of the cup part 43, respectively. In the operation corresponding to Step S135, the third solution splashed from the rotating dummy substrate is received by the inner annular surface 451a of the annular sidewall 451 and also adheres on the outer annular surface 441b of the annular sidewall 441, to form third solution layers (shown by thick lines 75a, 74b in FIG. 17) on the inner annular surface 451a of the outermost cup part 45 and the outer annular surface 441b of the cup part 44, respectively. Then, in the operation corresponding to Step S14, the pure water splashed from the rotating dummy substrate is received by the outer annular surface 451b of the annular sidewall 451 and a water layer becoming conductive (shown by a thick line 75b in FIG. 17) is also formed on the outer annular surface 451b of the outermost cup part 45. As a result, each surface of the inner annular surfaces 421a, 431a, 441a, 451a and the outer annular surfaces 421b, 431b, 441b, 451b in the cup parts 42 to 45, has the water layer 72a or 75b, the first solution layer 73a or 72b, the second solution layer 74a or 73b or the third solution layer 75a or 74b, as a surface layer with a resistivity which is smaller than that of the annular sidewalls 421, 431, 441, 451.

Actually, when the pure water is applied to the outer annular surface 451b of the outermost cup part 45, the pure water also adheres on a surface of the supporting member 53 in FIG. 13, and thus the water layer 75b of the outer annular surface 451b is substantially electrically grounded with interposing a water layer formed on the surface of the supporting member 53, the conductive sheet 531, and the ball screw mechanism 52. In other words, the water layer on the surface of the supporting member 53, the conductive sheet 531, and the ball screw mechanism 52 serve as a ground part for grounding the water layer 75b. The conductive sheet 531 may be directly connected to the water layer 75b of the outer annular surface 451b.

After unloading the dummy substrate, the above Steps S11 to S16 in accordance with the basic operation of the substrate processing apparatus 1a are performed on a substrate 9 to be actually processed. In this time, the surface layer becoming conductive, which is formed on the inner annular surface 421a of the inner cup part 42 in FIG. 17, suppresses occurrence of frictional charging in the inner annular surface 421a of the cup part 42, which is caused by the pure water splashed from the rotating substrate 9 in Steps S12, S132, and S134. Induction charging of the substrate 9 is surely suppressed by the surface layers which are formed on the outer annular surface 421b of the cup part 42 and the inner annular surfaces and the outer annular surfaces of the cup parts 43 to 45 which are located outside the cup part 42. Further, the surface layer formed on the outer annular surface 451b of the outermost cup part 45 suppresses occurrence of frictional charging in the outer annular surface 451b of the outermost cup part 45, caused by the pure water splashed from the rotating substrate 9 in Step S14, and induction charging of the substrate 9 is surely suppressed by the surface layers which are formed on the outermost cup part 45 and the cup parts 42 to 44 which are located inside the outermost cup part 45. Also, even if the bottom parts 423, 433, 443, 453 of the cup parts 42 to 45 in FIG. 13 are charged, charging potential of the bottom parts 423, 433, 443, 453 is reduced by the conductive plate 490, thereby suppressing induction charging of the substrate 9.

Also in Steps S12, S131 to S135, and S14 which are performed on the substrate 9 to be actually processed, since the pure water, the first solution, the second solution or the third solution is applied to each surface of the inner annular surfaces 421a, 431a, 441a, 451a and the outer annular surfaces 421b, 431b, 441b, 451b of the cup parts 42 to 45, each surface of the inner annular surfaces 421a, 431a, 441a, 451a and the outer annular surfaces 421b, 431b, 441b, 451b of the cup parts 42 to 45 surely keeps a state where the surface holds water with conductivity, the first solution, the second solution, or the third solution in processing the next substrate 9 which is processed after the above substrate 9.

Herein, discussion will be made on an example of an electric discharge phenomenon which occurs on a substrate in a substrate processing apparatus in accordance with an example for comparison. The substrate processing apparatus in accordance with the example for comparison has the same construction as the substrate processing apparatus 1a of FIG. 13 and the hydrophilic treatment is not performed on any surfaces of inner annular surfaces and outer annular surfaces of a plurality of cup parts. In the substrate processing apparatus, pure water is applied onto the substrate in a state where the substrate is disposed in the pre-rinse position, the pure water is splashed toward the innermost cup part, and then the cup part is charged after the pure water is dripped from the cup part. Then, the main body of the substrate is charged by induction because of charging of the cup part. In this time, if the pure water is kept on the substrate, $CO_2$ and the like dissolves into the pure water, the pure water changes to water with conductivity, and consequently, electric discharge can occur on the substrate. Also, if the cup parts move up and down in a state where the water becoming conductive remains on the substrate, a relative position between the substrate and the charged cup part is changed to alter the potential of the main body of the substrate. As a result, electric discharge can occur on the substrate (that is to say, dielectric breakdown of an insulating film on the substrate occurs) while the cup parts move up and down.

On the other hand, in the substrate processing apparatus 1a of FIG. 13, since the processing for the substrate 9 is performed in a state where the water, the first solution, the second solution, or the third solution is held on each surface of the inner annular surfaces 421a, 431a, 441a, 451a and the outer annular surfaces 421b, 431b, 441b, 451b of the cup parts 42 to 45, the charged potential of a cup part caused by the splashed pure water can be surely suppressed by liquid layers including water which are formed on the cup part and other cup part. As a result, it is possible to prevent occurrence of electric discharge on the substrate 9 which is caused by charging of the cup part, in application of the processing solution onto the substrate 9, up and down movement of the cup parts 42 to 45, or the like. Also, the inner cup parts 42 to 44 may be substantially electrically grounded depending on design of the substrate processing apparatus 1a (the same as in substrate processing apparatuses in FIGS. 18 and 19 discussed later).

Figure 18:
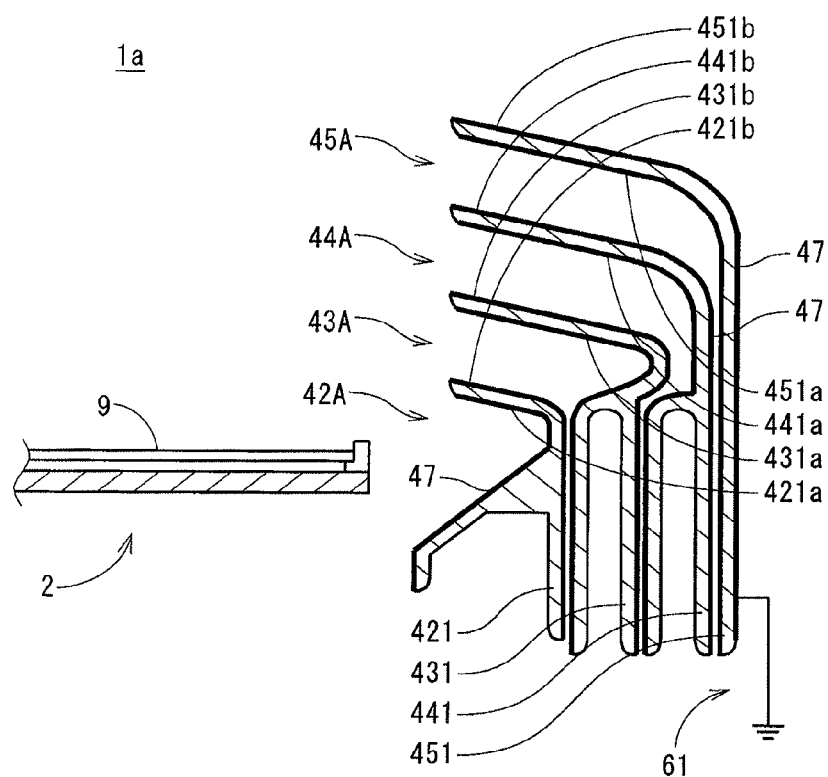
FIG. 18 is a view showing another example of the substrate processing apparatus.

FIG. 18 is a view showing another example of the substrate processing apparatus 1a. Similarly to the cup part 41A of FIG. 6, the conductive resin film 47 is attached on each surface of inner annular surfaces and outer annular surfaces of main bodies in annular sidewalls 421, 431, 441, 451 in the substrate processing apparatus 1a of FIG. 18. Each surface of inner annular surfaces 421a, 431a, 441a, 451a and outer annular surfaces 421b, 431b, 441b, 451b of cup parts 42A to 45A is the surface of the conductive resin film 47 in the substrate processing apparatus 1a of FIG. 18. Since the outer cylindrical part 4512 of the annular sidewall 451 in the outermost cup part 45 is omitted, the outer annular surface 451b includes a portion corresponding to the outer annular surface of the inner cylindrical part 4511. The outer annular surface 451b of the outermost cup part 45 is directly connected to a ground part 61. Arrangement of the plurality of cup parts 42A to 45A and the other constituent elements of the apparatus are the same as those in the substrate processing apparatus 1a of FIG. 13 and are represented by the same reference signs.

Figure 19:
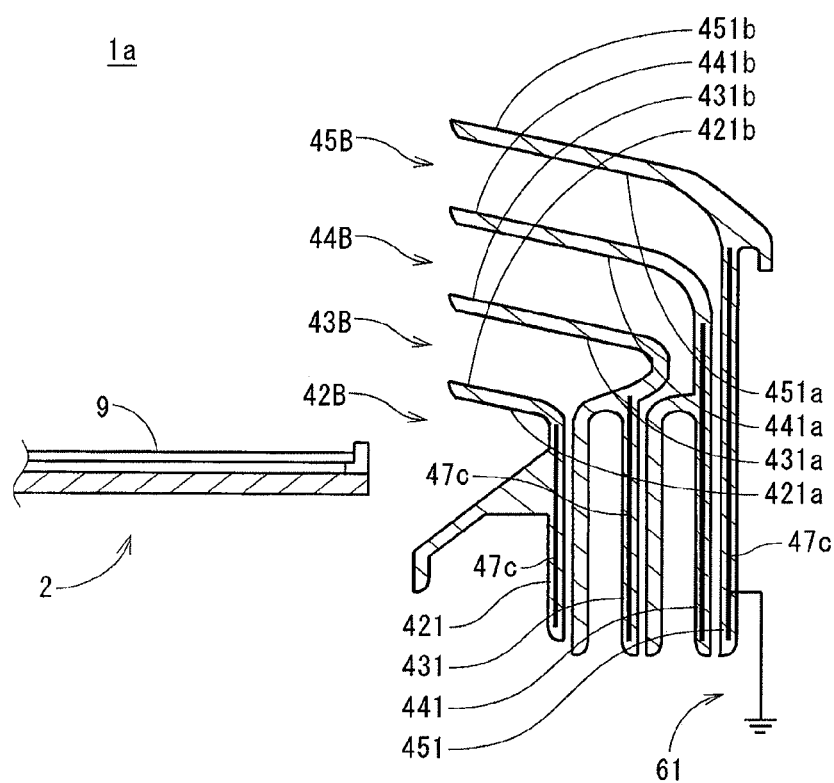
FIG. 19 is a view showing still another example of the substrate processing apparatus.
Figure 21:
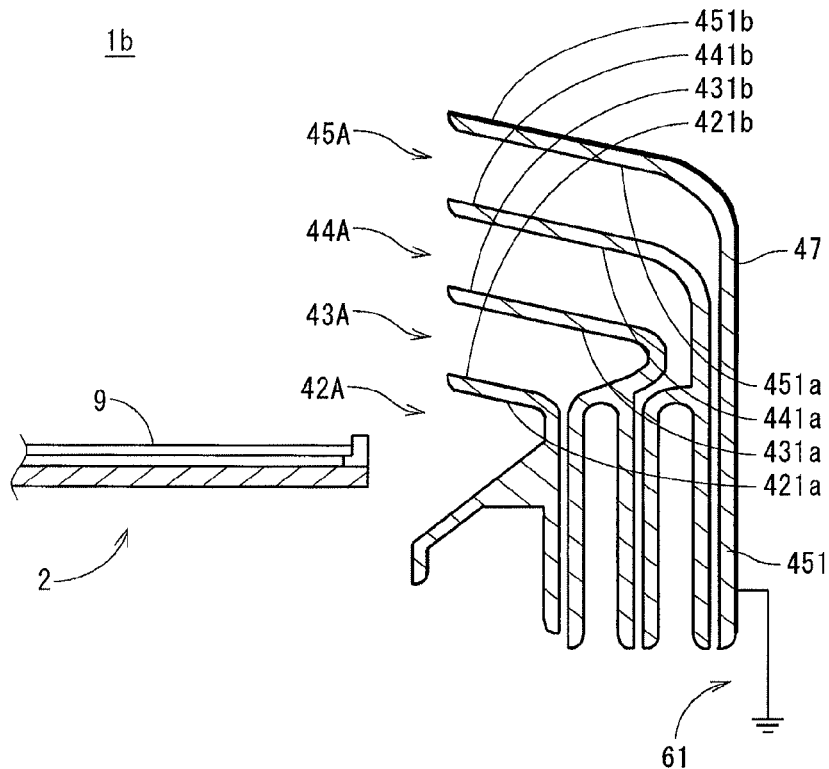
FIG. 21 is a view showing another example of the substrate processing apparatus.
Figure 22:
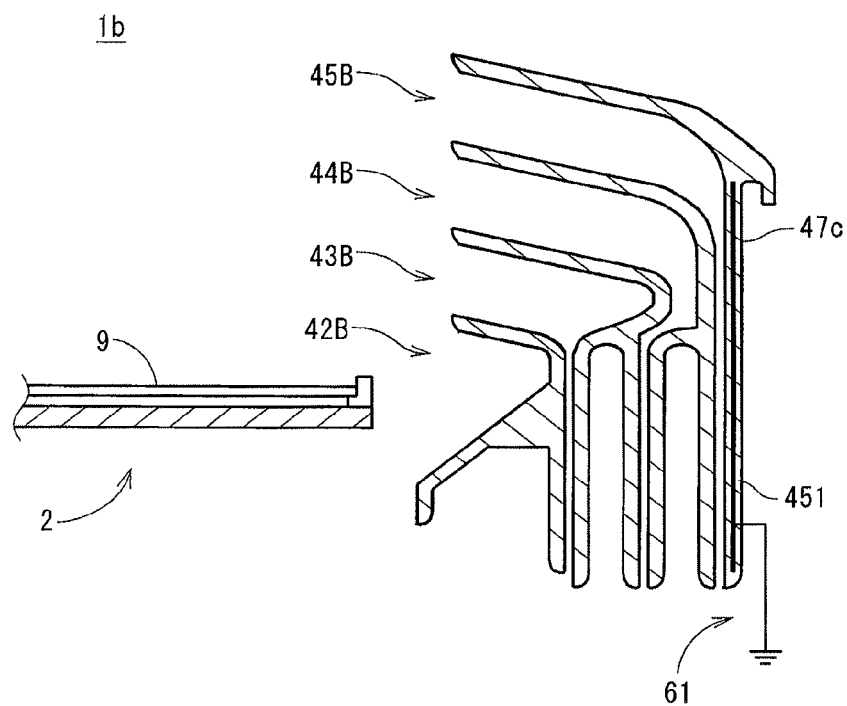
FIGS. 22 to 24 are views each showing still another example of the substrate processing apparatus.
Figure 23:
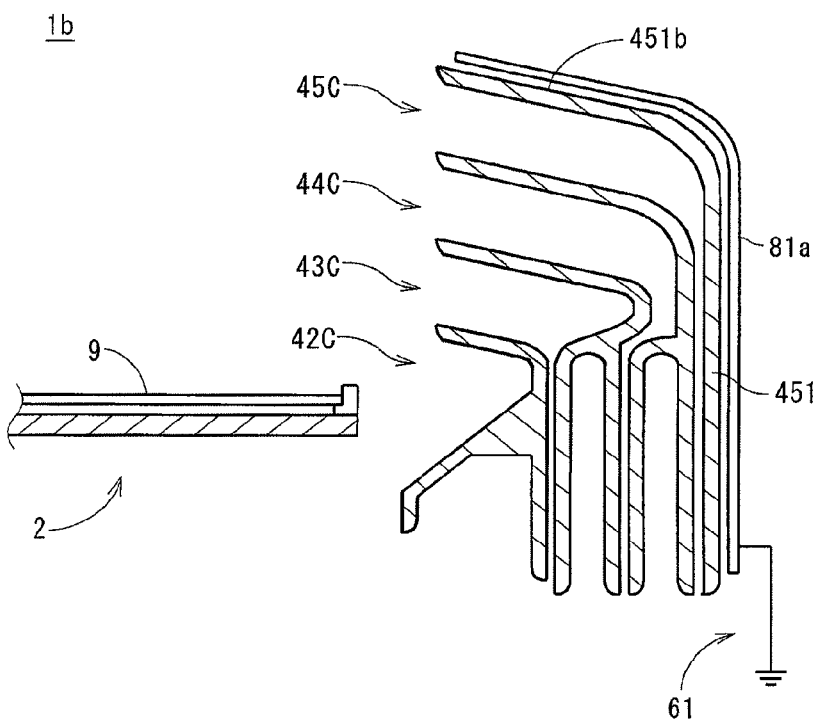

When the substrate 9 is processed in the substrate processing apparatus 1a of FIG. 18, the operation of Step S10 in FIG. 2 is omitted and the chuck 21 is disposed in the cup parts 42A to 45A also in the post-rinse of the substrate 9 using pure water in Step S14 (that is to say, pure water is not applied to the outer annular surface 451b of the outermost cup part 45A) (the same as in the substrate processing apparatus 1a of FIG. 19 and substrate processing apparatuses 1b of FIGS. 21 to 23 which are discussed later).

As described above, since the inner annular surfaces 421a, 431a, 441a, 451a and the outer annular surfaces 421b, 431b, 441b, 451b of the respective cup parts 42A to 45A are surfaces of members with a resistivity which is smaller than that of the main bodies of the annular sidewalls 421, 431, 441, 451 in the substrate processing apparatus 1a of FIG. 18, the charged potential of the cup part which is caused by the plashing pure water can be surely suppressed and consequently, it is possible to prevent occurrence of electric discharge on the substrate 9 caused by charging of the cup part, in application of the processing solution onto the substrate 9 or the like. Similarly to the cup part 41A of FIG. 7, the inner annular surfaces and the outer annular surfaces of the cup parts 42A to 45A may partly include the surfaces of the conductive members arranged in the circumferential direction at regular intervals.

FIG. 19 is a view showing still another example of the substrate processing apparatus 1a. In cup parts 42B to 45B in the substrate processing apparatus 1a of FIG. 19, a plurality of rod conductive members (shown by thick lines 47c in FIG. 19) are provided in each of annular sidewalls 421, 431, 441, 451, similarly to the cup part 41B of FIG. 11. Actually, the plurality of conductive members 47c are arranged in the circumferential direction of the annular sidewalls 421, 431, 441, 451 at regular intervals (see FIG. 11). Inner annular surfaces 421a, 431a, 441a, 451a and outer annular surfaces 421b, 431b, 441b, 451b of the cup parts 42B to 45B are surfaces of electrical insulation material and they have water repellency (the same as in the substrate processing apparatuses 1b of FIGS. 22 and 23 which are discussed later). Arrangement of the plurality of cup parts 42B to 45B and the other constituent elements of the apparatus are the same as those in the substrate processing apparatus 1a of FIG. 13 and are represented by the same reference signs.

In the respective cup parts 42B to 45B all of which have the same structure, the annular sidewalls 421, 431, 441, 451 have internal portions with a resistivity which is smaller than that of the material forming their main bodies (in the cup parts 42B to 45B of FIG. 19, the main bodies are portions excluding the conductive members 47c in the annular sidewalls 421, 431, 441, 451) in the substrate processing apparatus 1a of FIG. 19. With this structure, charged potential of a cup part caused by the splashed pure water can be surely suppressed to prevent occurrence of electric discharge on the substrate 9. The conductive member or the sealed liquid may be provided in the internal portions of the annular sidewalls 421, 431, 441, 451 across their whole circumferences (the same as in an annular sidewall 451 of FIG. 22 discussed later).

Figure 20:
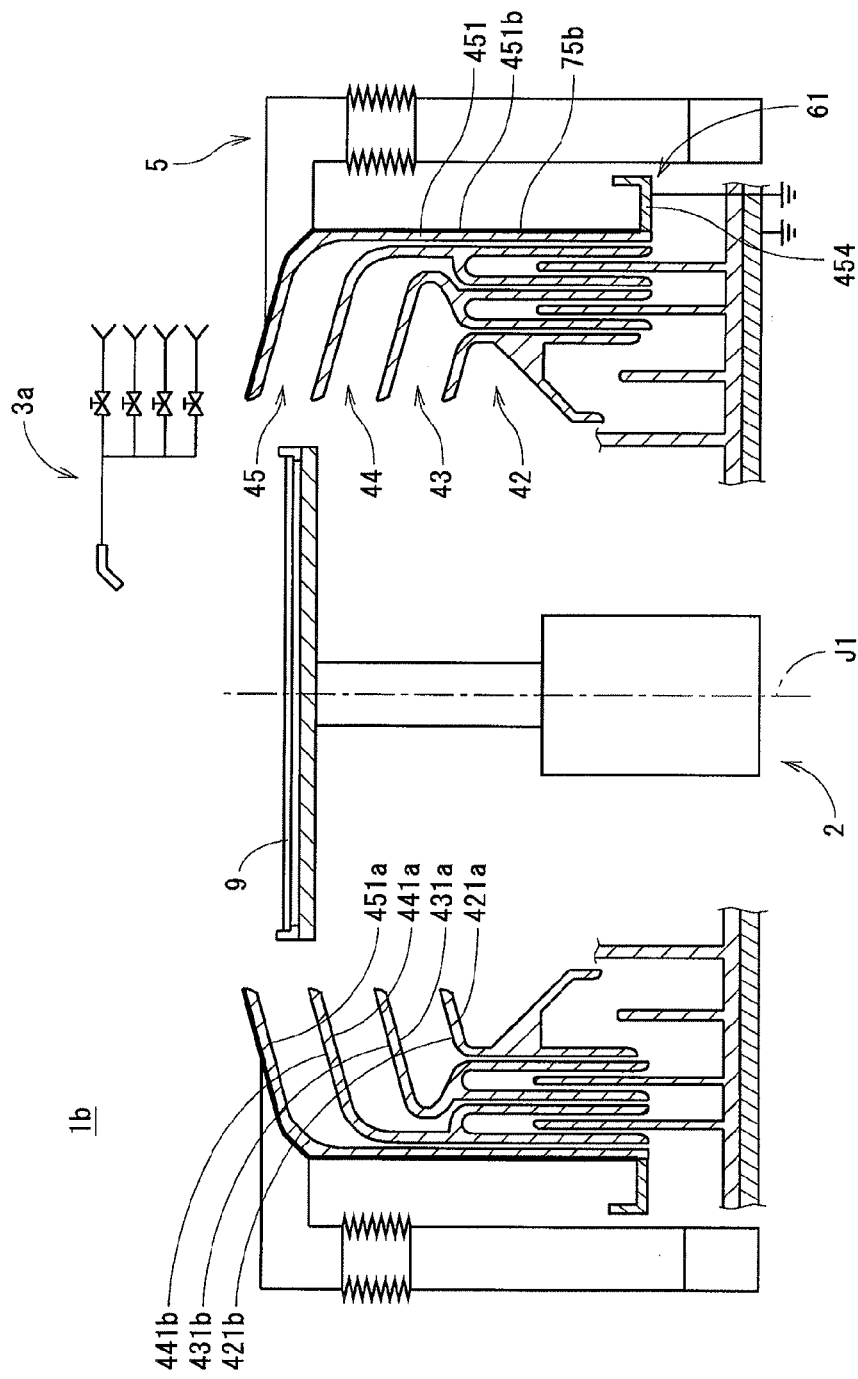
FIG. 20 is a view showing a construction of a substrate processing apparatus in accordance with a third preferred embodiment.

FIG. 20 is a view showing the substrate processing apparatus 1b having a plurality of cup parts 42 to 45 in accordance with the third preferred embodiment of the present invention. The outer cylindrical part 4512 of the annular sidewall 451 in the outer cup part 45 (i.e., the outermost cup part 45) in the substrate processing apparatus 1a of FIG. 13 is omitted in the substrate processing apparatus 1b of FIG. 20. The hydrophilic treatment is only performed on an outer annular surface 451b of the outermost cup part 45 (the outer annular surface 451b includes a portion corresponding to the outer annular surface of the inner cylindrical part 4511 in the outermost cup part 45 of FIG. 13). An inner annular surface 451a of the outermost cup part 45 and inner annular surfaces 421*a*, 431*a*, 441*a* and outer annular surfaces 421*b*, 431*b*, 441*b* of the other cup parts 42 to 44 are surfaces of electrical insulation material and they have water repellency. An auxiliary drain part 454, which spreads on an outside in a ring shape, is provided on a lower end portion of the outermost cup part 45 and a top end of the auxiliary drain part 454 bends upwards. The auxiliary drain part 454 formed of conductive material is grounded at a position away from the outermost cup part 45 by a ground part 61. The shapes of the inner cup parts 42 to 44 and the other constituent elements of the substrate processing apparatus 1*b* are the same as those in the substrate processing apparatus 1*a* of FIG. 13.

A basic operation of the substrate processing apparatus 1*b* is the same as in the substrate processing apparatus 1*a* of FIG. 13, but the operation for preparation which is performed with use of the dummy substrate is different from that in the substrate processing apparatus 1*a*. Specifically, in the operation using the dummy substrate (FIG. 2: Step S10), the elevating mechanism 5 moves the cup parts 42 to 45 relatively to the substrate holding part 2 in a direction along the central axis J1 as a unit and an upper end portion of the annular sidewall 451 in the outermost cup part 45 is positioned below the dummy substrate. Ejection of pure water is started (see FIG. 17) to form a water layer (shown by a thick line 75*b* in FIG. 20) on the outer annular surface 451*b* of the outermost cup part 45 by the pure water splashed from the rotating dummy substrate, and then the operation for holding liquid in the cup part with use of the dummy substrate is completed. Subsequently, the above Steps S11 to S16 in accordance with the basic operation are performed on a substrate 9 to be actually processed, similarly to the substrate processing apparatus 1*a* of FIG. 13.

Though frictional charging occurs in the inner annular surface 421*a* of the cup part 42 due to the pure water splashed from the rotating substrate 9 in Steps S12, S132 and S134, charged potential of the inner cup part 42 can be suppressed to some extent by the water layer 75*b* with conductivity which is formed on the whole outer annular surface 451*b* of the outermost cup part 45, and therefore, it is possible to prevent electric discharge from occurring on the substrate 9.

As described above, the liquid including water is only held on the outer annular surface of the cup part in the substrate processing apparatuses 1, 1*b* of FIGS. 1, 4, and 20, the liquid including water is only held on the inner annular surface of the cup part in the substrate processing apparatus 1 of FIG. 5, and the liquids including water are held on the inner annular surface and the outer annular surface of the cup part in the substrate processing apparatus 1*a* of FIG. 13. With this structure, it is possible to suppress charged potential of the cup part which is charged by splashing of pure water. Accordingly, from the viewpoint of suppressing charged potential of the cup part, it is required that the liquid including water (i.e., water or liquid containing water) is held on at least one surface of the inner annular surface and the outer annular surface of the cup part.

Depending on design of the substrate processing apparatus or a kind of solution used in the substrate processing apparatus, there is a case where, from the viewpoint of producing no effect on the process, it is preferable the water layer 71 or 75*b* is formed on the outer annular surface 411*b* of one cup part 41 or the outer annular surface 451*b* of the outermost cup part 45 out of the plurality of concentric cup parts 42 to 45, that is to say, the water layer 71 or 75*b* is only formed on a surface on which the solution splashed from the substrate 9 does not adhere in substrate processing using the solution, like in the substrate processing apparatus 1 of FIG. 1 and the substrate processing apparatus 1*b* of FIG. 20. Therefore, in order to easily suppress charged potential of the cup parts 41 to 45 without affecting the process, it is preferable the liquid including water is held on the outer annular surfaces 411*b*, 451*b* of the outermost cup parts 41, 45 which are located on the outermost side of at least one cup part.

FIG. 21 is a view showing another example of the substrate processing apparatus 1*b*. The substrate processing apparatus 1*b* of FIG. 21 is different from the substrate processing apparatus 1*a* of FIG. 18 in that only the outer annular surface 451*b* of the annular sidewall 451 in the outermost cup part 45A out of the cup parts 42A to 45A in FIG. 18 is the surface of the conductive resin film 47, and the inner annular surface 451*a* of the outermost cup part 45 and the inner annular surfaces 421*a*, 431*a*, 441*a* and the outer annular surfaces 421*b*, 431*b*, 441*b* of other cup parts 42A to 44A are surfaces of electrical insulation material and they have water repellency. Also in the substrate processing apparatus 1*b* of FIG. 21, though frictional charging due to the pure water splashed from the substrate 9 occurs in the inner annular surface 421*a* of the cup part 42A where the whole annular sidewall 421 is formed of electrical insulation material, charged potential of the inner cup part 42A can be suppressed by the outermost cup part 45A to some extent and consequently, it is possible to prevent occurrence of electric discharge on the substrate 9.

Although only the outer annular surface of the cup part (the outermost cup part) includes the surface of the member with a resistivity which is smaller than that of the main body of the cup part in the substrate processing apparatuses 1, 1*b* of FIGS. 6 and 21 and the inner annular surface and the outer annular surface of the cup part include the surfaces of the members with a resistivity which is smaller than that of the main body of the cup part in the substrate processing apparatus 1*a* of FIG. 18, it is also possible to suppress charged potential of the cup part by only including the surface of the member with a resistivity which is smaller than that of the main body, in the inner annular surface of the cup part in the substrate processing apparatus. That is to say, in order to suppressing charged potential of the cup part which is charged by splashing of pure water, it is required that at least one surface of the inner annular surface and the outer annular surface of the cup part includes the surface of the member with a resistivity which is smaller than that of the main body of the cup part.

FIG. 22 is a view showing still another example of the substrate processing apparatus 1*b*. The substrate processing apparatus 1*b* of FIG. 22 is different from the substrate processing apparatus 1*a* of FIG. 19 in that the plurality of rod conductive members 47*c* (shown by a thick line in FIG. 22) are only provided within the outermost cup part 45B, and the other constituent elements are the same as those in the substrate processing apparatus 1*a* of FIG. 19. In the substrate processing apparatus 1*b* of FIG. 22, charged potential of the inner cup part 42B, which is generated by the pure water splashed from the substrate 9, can be suppressed by the outermost cup part 45B to some extent and consequently, it is possible to suppress occurrence of electric discharge on the substrate 9.

FIG. 23 is a view showing still another example of the substrate processing apparatus 1*b*. Similarly to the substrate processing apparatus 1 of FIG. 12, the approximately cylindrical member 81*a* is provided around an annular sidewall 451 of the outermost cup part 45C in the substrate processing apparatus 1*b* of FIG. 23. The inner surface of the cylindrical member 81*a* is along an outer annular surface 451*b* of the annular sidewall 451 and a clearance is formed between the inner surface of the cylindrical member 81*a* and the outer annular surface 451*b*. The cylindrical member 81*a* is connected to a ground part 61 to be grounded. Also in the substrate processing apparatus 1*b* having a plurality of cup parts 42C to 45C, since the conductive cylindrical member 81*a* is provided close to the outer annular surface 451*b* of the outermost cup part 45C similarly to the substrate processing apparatus 1 of FIG. 12, charged potential of the inner cup part 42C which is generated by the pure water splashed from the substrate 9 can be suppressed to some extent and it is therefore possible to suppress occurrence of electric discharge on the substrate 9.

As discussed above, since the cylindrical member with a resistivity which is smaller than that of the outermost cup parts 41C, 45C is provided close to the outer annular surfaces 411*b*, 451*b* of the outermost cup parts 41C, 45C which are located on the outermost side out of at least one cup part, it is possible to suppress charged potential of the cup part without changing the structure of the cup part.

Though the substrate processing apparatuses 1, 1*a*, 1*b* in accordance with the first to third preferred embodiments have been discussed above, the substrate processing apparatuses 1, 1*a*, 1*b* allow various variations.

As described above, since the liquid including water (i.e., water or liquid containing water) is held on at least one surface of the inner annular surface and the outer annular surface of the cup part or at least one surface of the inner annular surface and the outer annular surface of the cup part includes the surface of the member with a resistivity which is smaller than that of the main body of the cup part, it is possible to suppress charged potential of the cup part in the substrate processing apparatus. In a case where an inner annular surface with water repellency is required for ensuring a constant draining performance, it is preferable the liquid including water is only held on the outer annular surface or the surface of the member with a resistivity which is smaller than that of the main body is only included in the outer annular surface, like the cup part 41 of FIG. 1, the cup part 41 of FIG. 4, the cup part 41A of FIG. 6, the outermost cup part 45 of FIG. 20, and the outermost cup part 45A of FIG. 21. On the other hand, since frictional charging due to the pure water splashed from the substrate 9 normally occurs in the inner annular surface of the cup part, the liquid including water is held on at least inner annular surface or the surface of the member with the small resistivity is included in at least inner annular surface and thus, it is possible to decrease an amount of charge in the cup part and further suppress charged potential of the cup part.

Figure 24:
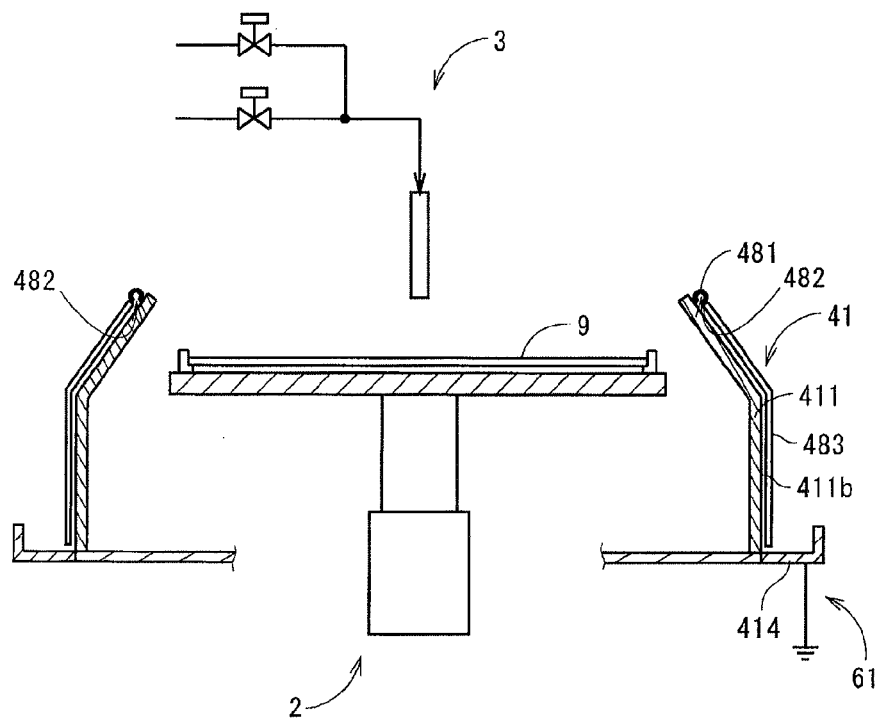

Though the liquid layer including water is formed on the inner annular surface or the outer annular surface of the cup part by the processing liquid ejected from the processing liquid applying parts 3, 3*a* in the substrate processing apparatuses 1, 1*a*, 1*b* of FIGS. 1, 4, 5, 13 and 20, there may be a case like a cup part 41 shown in FIG. 24 where, for example, a ring-shape supply pipe 481 is provided around an upper end portion of an annular sidewall 411 as a liquid supplying part and liquid including water with conductivity is supplied to an outer annular surface 411*b* of the annular sidewall 411 from a plurality of holes 482 which are formed in the supply pipe 481. In the cup part 41 of FIG. 24, an approximately cylindrical auxiliary member 483 (Hatching of its cross section is omitted in FIG. 24.) is provided around the annular sidewall 411. The inner surface of the auxiliary member 483 is along the outer annular surface 411*b* and a small clearance is formed between the inner surface of the auxiliary member 483 and the outer annular surface 411*b*. The liquid supplied from the supply pipe 481 can be held between the outer annular surface 411*b* of the annular sidewall 411 and the auxiliary member 483. Also, in a case where the liquid supplying part for continuously supplying liquid is provided like the cup part 41 in FIG. 24, for example, pure water or the like may be substantially held on the outer annular surface of the cup part only by forming a plurality of grooves in the outer annular surface, to form a surface layer becoming conductive.

The technique of using the textile material 46 or the mesh member in the cup part 41 of FIG. 4 can be applied to the substrate processing apparatuses 1*a* or 1*b* of FIG. 13 or 20 having the plurality of cup parts 42 to 45.

As discussed above, since it is required to prevent metal impurities from adhering on the substrate 9 in the processing of the substrate 9 in the substrate processing apparatus, metal cannot be normally used in the internal portion of the cup part or the surface of the cup part. However, depending on design of the cup part, a kind of a substrate to be processed or the like, there may be a case where a ring-shaped member formed of metal which is hard to dissolve (such as gold or platinum) is provided within the ring-shaped groove 415 instead of the sealed liquid 47*b* of FIG. 9 or the conductive member 47*c* of FIGS. 11, 19 and 22 may be formed of the metal. In order to surely prevent elution of metal in the cup part, it is preferable the conductive member is formed of nonmetal material.

The four conductive members 47*a* are arranged in the circumferential direction of the annular sidewall 411 at regular intervals in the cup part 41A of FIG. 8. From the viewpoint of suppressing charged potential in the nearly whole circumference of the cup part 41A, however, it is important that a member, which has surface(s) included in the inner annular surface 411*a* or the outer annular surface 411*b* of the annular sidewall 411 and has a resistivity which is smaller than that of the main body of the cup part 41A, is provided as a set of three or more elements (element members) which are arranged in the circumferential direction of the cup part 41A at regular intervals. Also in the cup part 41B of FIG. 11, the four conductive members 47*c* are arranged in the circumferential direction of the annular sidewall 411 at regular intervals. In order to suppress charged potential in the nearly whole circumference of the cup part 41B, it is important that an internal portion, which is provided in the annular sidewall 411 and has a resistivity which is smaller than that of the main body of the cup part 41B, is provided as a set of three or more elements (element portions) which are arranged in the circumferential direction of the annular sidewall 411 at regular intervals.

Although pure water and the solution are applied onto the substrate 9 from the processing liquid applying parts 3, 3*a* in the above first to third preferred embodiments, even in an apparatus for only applying pure water, electric discharge can occur on a substrate in a state where water remains on the substrate as discussed above. Therefore, it is important the above technique where charged potential of the cup part is suppressed to prevent occurrence of electric discharge on the substrate is used in a case where a substrate processing apparatus has a processing liquid applying part for applying at least pure water, onto the substrate.

In the substrate processing apparatuses 1, 1*a*, 1*b* of FIGS. 1, 4, 13 and 20, the substrate 9 is held so that the normal direction of the substrate 9 is the vertical direction, the substrate 9 is cleaned by pure water in a state where the upper end portion of the cup part is positioned below the substrate 9, and then the pure water is efficiently applied to the outer annular surface of the outermost cup part (in a case where only one cup part is provided, the outer annular surface of the cup part) in the course of processing of the substrate 9, thereby easily forming the water layer. Conversely, when it is not required to apply pure water to the outer annular surface of the outermost cup part, the normal direction of the substrate 9 is not necessarily along the vertical direction. Also, application of pure water to the outer annular surface of the outermost cup part does not necessarily have to be performed in processing of all substrates 9 but may be only performed in processing of every predetermined number of substrates 9.

Although the processing liquid splashed from the substrate 9, which is rotated by the substrate holding part 2, is received by the cup part in the substrate processing apparatuses 1, 1a, 1b, there may be a case where, for example, the rotation mechanism is omitted in the substrate holding part, pure water is applied onto the substrate 9 held by the substrate holding part, and thereafter the pure water which is splashed from the substrate 9 by air from an air knife provided separately is received by the cup part. Also in this case, the above technique of suppressing charged potential of the cup part should be used because the cup part is charged by the splashed pure water.

Thought the cup part moves up and down by the elevating mechanism 5 in the above first to third preferred embodiments, the cup part is fixed and the substrate holding part 2 for holding the substrate 9 may be moved up and down. In other words, the cup part moves up and down relatively to the substrate holding part 2.

(The main bodies of) the cup parts in FIGS. 6 to 12, 18, 19, and 21 to 23 are not necessarily formed of electrical insulation material. The main body of the cup part where at least one surface of the inner annular surface and the outer annular surface includes the surface of the member with a resistivity which is smaller than that of the main body and the main body of the cup part where the internal portion has a resistivity which is smaller than that of the main body, may be formed of semiconductor material with a resistivity (for example, a resistivity of 2 MΩ·cm or more) which is higher than that of the member or that of the internal portion. Also in this case, charged potential of the cup part can be suppressed by the member or the internal portion to reduce induction charging of the substrate 9. Similarly, one cup part or the plurality of cup parts, where the cylindrical member is provided close to the outer annular surface of the outermost cup part, may be formed of semiconductor material with a resistivity which is higher than that of the cylindrical member.

An object to be processed in the substrate processing apparatus may be a substrate such as a glass substrate, other than a semiconductor substrate.

Figure 25:
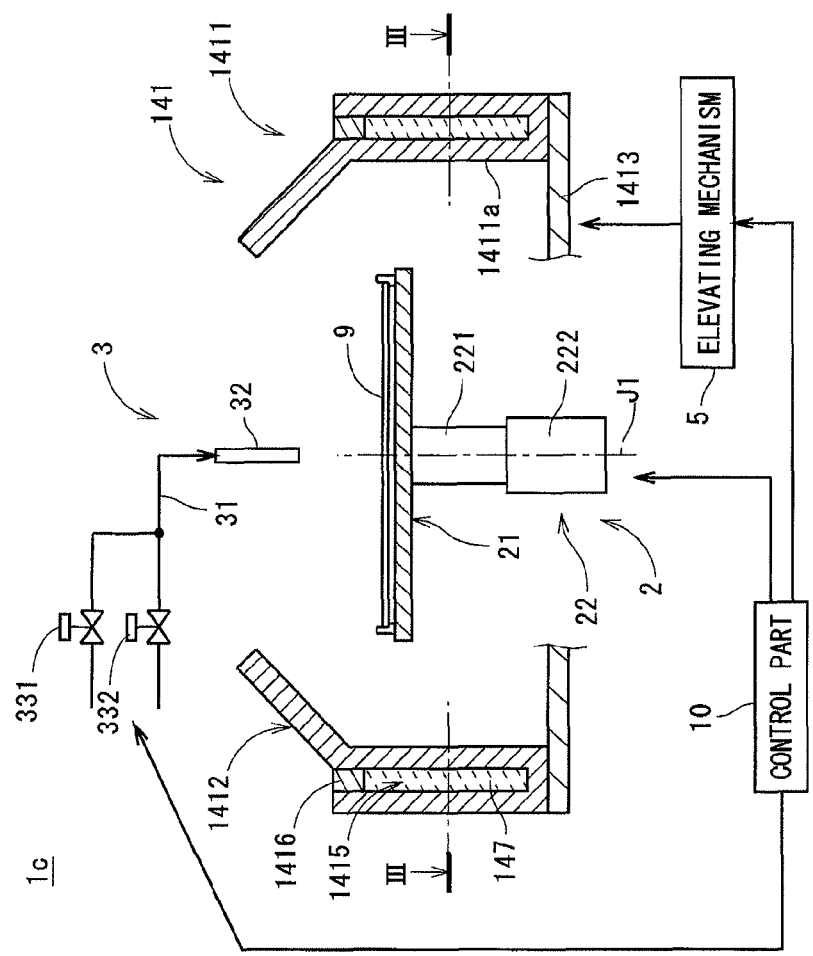
FIG. 25 is a view showing a construction of a substrate processing apparatus in accordance with a fourth preferred embodiment.

FIG. 25 is a view showing a construction of a substrate processing apparatus 1c in accordance with the fourth preferred embodiment of the present invention.

The substrate processing apparatus 1c shown in FIG. 25 has the same construction as the substrate processing apparatus 1 of FIG. 1 except for a cup part 141. In FIG. 25, a part of the substrate holding part 2 is shown cross-sectionally for convenience of illustration (the same as in FIGS. 29 and 31 discussed later).

The cup part 141 has an annular sidewall 1411 which is arranged around the chuck 21 to prevent processing liquid applied onto the substrate 9 from being splashed around the annular sidewall 1411, and an upper portion of the annular sidewall 1411 is an inclined part 1412 whose diameter decreases toward the processing liquid applying part 3 (i.e., upwards). A ring-shaped bottom part 1413, which protrudes toward the central axis J1 and covers the lower space of the chuck 21, is attached to a lower end portion of the annular sidewall 1411, and a drain outlet (not shown) for draining the processing liquid is provided in the bottom part 1413.

Figure 26:
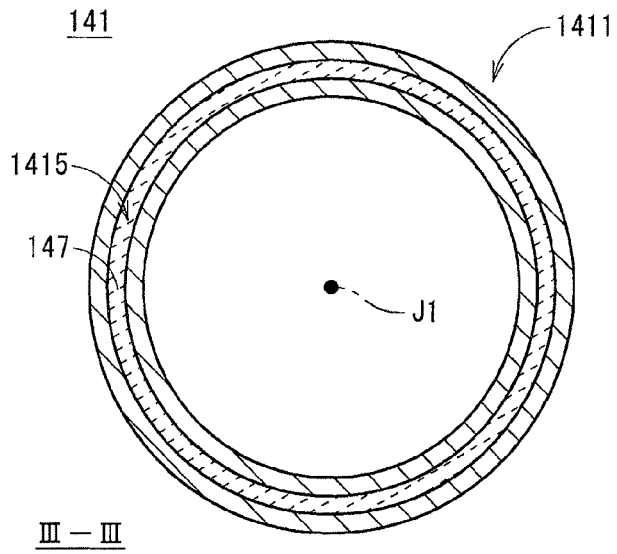
FIG. 26 is a cross-sectional view of a cup part.

FIG. 26 is a cross-sectional view of the cup part 141 at the position indicated by the arrows III-III in FIG. 25. As shown in FIGS. 25 and 26, an annular sidewall 1411 of the cup part 141 has a deep ring-shaped groove 1415 around the central axis J1 and the ring-shaped groove 1415 is filled with a pure water 147. As shown in FIG. 25, since an opening of the ring-shaped groove 1415 which is on the side of an inclined part 1412 is closed by a ring-shaped lid member 1416, the pure water 147 is held (sealed) in the annular sidewall 1411. The main body of the cup part 141 is formed of Teflon (trademark) (in the cup part 141 of FIG. 25, the main body is a part excluding a portion of the pure water 147 in the annular sidewall 1411) and an inner annular surface 1411a has water repellency (hydrophobicity). A relative dielectric constant (relative permittivity) of the pure water 147 held in the annular sidewall 1411 is about 80 which is higher than that of Teflon (trademark) forming the main body of the cup part 141 (the relative dielectric constant of Teflon (trademark) is about 3 to 4).

Figure 27:
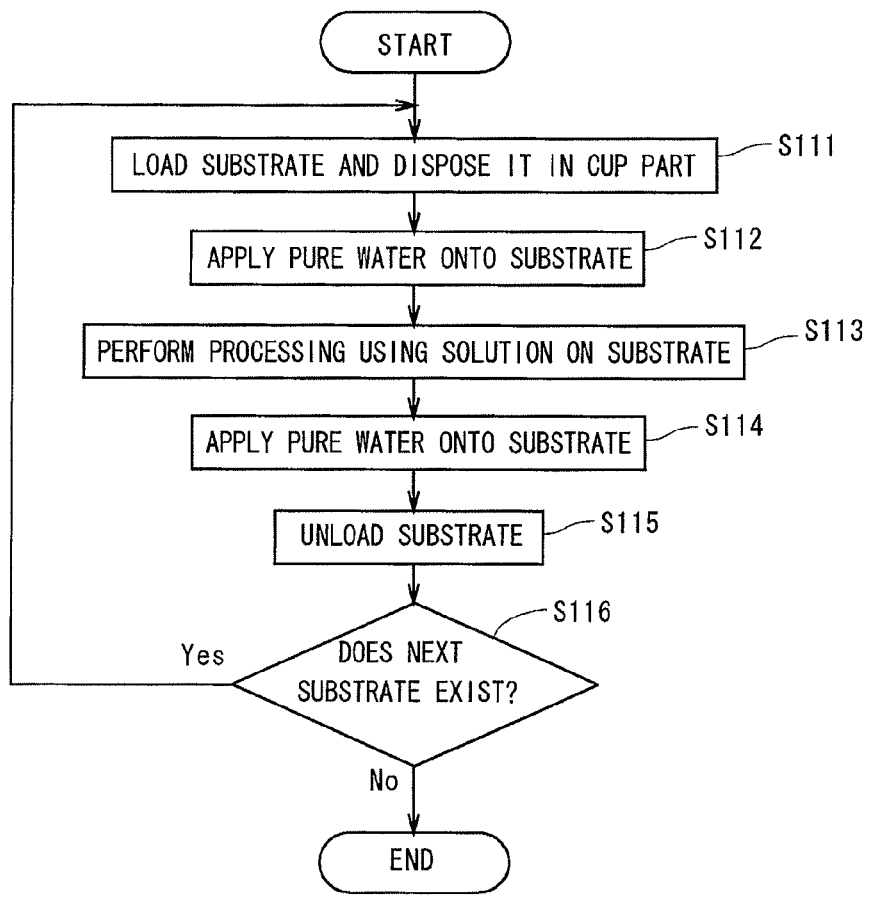
FIG. 27 is a flowchart showing an operation flow for processing a substrate by applying processing liquid onto the substrate.

Next discussion will be made on an operation flow of the substrate processing apparatus 1c for processing a substrate by applying the processing liquid onto the substrate with reference to FIG. 27. First, the cup part 141 is moved down by the elevating mechanism 5 to position an upper end portion of the cup part 141 below the chuck 21, a substrate to be processed is placed on the chuck 21 by an external carrying mechanism, and held by the substrate holding part 2 (i.e., the substrate 9 is loaded). The cup part 141 is moved upwards to dispose the chuck 21 in the cup part 141 and the substrate 9 is surrounded by the cup part 141 (Step S111).

Rotation of the substrate 9 is started by the substrate holding part 2, pure water is applied on onto the upper surface of the substrate 9 by opening the pure water valve 331 in the processing liquid applying part 3, and thereby pre-rinse using pure water is performed on the substrate 9 (Step S112). In this time, the pure water which is applied from the processing liquid applying part 3 and is splashed from the rotating substrate 9 is received by the inner annular surface 1411a of the cup part 141, to cause frictional charging in the inner annular surface 1411a of the cup part 141. In the substrate processing apparatus 1c, however, since a charge capacity (capacitance) of the annular sidewall 1411 becomes large by holding the pure water 147 with a dielectric constant, which is higher than that of the main body, in the annular sidewall 1411, a charged potential (relative to a ground potential) of the inner annular surface 1411a is not greatly increased relatively to an electric charge generated in the inner annular surface 1411a (i.e., charged potential of the cup part 141 is suppressed in comparison with a case where the pure water 147 is not held or the ring-shaped groove 1415 is not formed in the annular sidewall 1411). Therefore, the substrate 9 placed on the chuck 21 is hardly charged by induction.

Next, the pure water valve 331 is closed in the processing liquid applying part 3 and the processing liquid applied onto the upper surface of the substrate 9 is switched from the pure water to the solution by opening the solution valve 332 (Step S113). Application of the solution onto the substrate 9 is continued for a predetermined time period to perform a processing using the solution on the substrate 9. Similarly to the case of application of pure water, the solution which is applied from the processing liquid applying part 3 and is splashed from the rotating substrate 9 is received by the inner annular surface 1411*a* of the cup part 141 and drained from the drain outlet in the bottom part 1413.

After the solution is applied onto the substrate 9 for the predetermined time period, the solution valve 332 is closed and the pure water valve 331 is opened. Thus, the processing liquid applied onto the upper surface of the substrate 9 is switched from the solution to the pure water, and thereby post-rinse using pure water is performed on the substrate 9 (Step S114).

After completion of the post-rinse for the substrate 9 using the pure water, ejection of pure water is stopped and rotation of the substrate 9 is stopped. The upper end portion of the cup part 141 (an end portion of the inclined part 1412) moves below the chuck 21 by the elevating mechanism 5, the substrate 9 is taken out by the external carrying mechanism (i.e., the substrate 9 is unloaded) (Step S115), and then the next substrate 9 to be processed is placed on the chuck 21 and disposed in the cup part 141 (Steps S116, S111). Then, the pre-rinse of the substrate 9 using the pure water (Step S112), the processing of the substrate 9 using the solution (Step S113), and the post-rinse of the substrate 9 using the pure water (Step S114) are performed similarly to the above operation. After completion of the post-rinse for the substrate 9, the substrate 9 is unloaded (Step S115).

After the processes in the above Steps S111 to S115 are repeated for each of a desired number of the substrates 9 (Step S116), operations in the substrate processing apparatus 1*c* are completed.

As discussed above, the annular sidewall 1411, which receives the processing liquid splashed from the substrate 9 by surrounding the substrate holding part 2, has the pure water 147 as an internal portion of the annular sidewall 1411, the internal portion (pure water 147) has a dielectric constant which is higher than that of the electrical insulation material forming the main body of the cup part 141 and extends continuously in a circumferential direction of the annular sidewall 1411 in the substrate processing apparatus 1*c* in FIG. 25. With this structure, it is possible to suppress the charged potential of the cup part 141 generated in splashing of the pure water, in the whole circumference of the annular sidewall 1411, without greatly increasing the manufacturing cost of the substrate processing apparatus 1*c* by forming the whole cup part with special conductive material. As a result, it is possible to prevent electric discharge from occurring on the substrate 9 due to induction charging of the substrate 9, in application of the processing liquid onto the substrate 9. Though there is a possibility that charging of the substrate causes adhesion of unwanted particles, which exist in atmosphere, on the substrate, since charging of the substrate is suppressed in the substrate processing apparatus 1*c*, it is possible to prevent adhesion of such particles.

In the meantime, it is required to prevent metal impurities from adhering on the substrate 9, for maintaining a constant yield in manufacturing of semiconductor products, in processing of the substrate 9 in the substrate processing apparatus 1*c*. However, since only pure water is held in the annular sidewall 1411 and metal is not used in the cup part 141 of FIG. 26, there is no possibility that the above problem of metal contamination, occurs (the same as in cup parts in FIGS. 28 to 31 discussed later).

Figure 28:
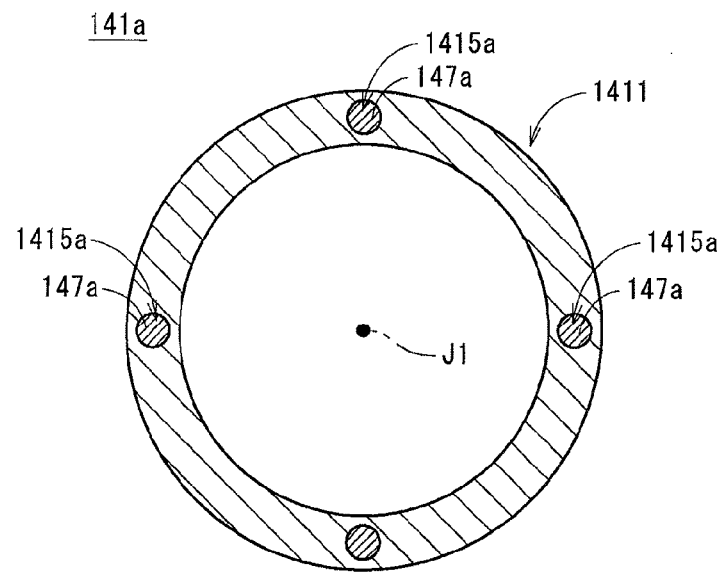
FIG. 28 is a view showing another example of a cup part.

FIG. 28 is a view showing another example of the cup part and is a cross-sectional view of a cup part 141*a* corresponding to FIG. 26. In the cup part 141*a* of FIG. 28, a plurality of deep holes 1415*a* in each of which a cross section perpendicular to the central axis J1 is round shape (actually, four holes 1415*a* each of which has an approximately same depth as the ring-shaped groove 1415 of FIG. 25) are formed, they are arranged in a circumferential direction of the annular sidewall 1411 at regular intervals (that is to say, the plurality of deep holes 1415*a* are arranged along a circle around the central axis J1 at equal angle intervals), and a cylindrical member 147*a* is inserted into each hole 1415*a*. The cylindrical member 147*a* is formed of ceramic such as silicon carbide (SiC) with a dielectric constant which is higher than that of the main body of the cup part 141 formed of electrical insulation material (a relative dielectric constant of SiC is 10). As discussed above, in the case that the cup part 141*a* has an internal portion which is a set of cylindrical members 147*a* arranged in the circumferential direction of the annular sidewall 1411 as parts of the annular sidewall 1411 and the internal portion has a dielectric constant which is higher than that of the electrical insulation material forming the main body of the annular sidewall 1411, it is possible to suppress the charged potential of the cup part 141*a* due to the splashed pure water in the substrate processing apparatus 1*c*. The cup part 141*a* of FIG. 28 can be easily produced at low cost only by providing the holes 1415*a* in the annular sidewall 1411 formed of electrical insulation material and inserting the cylindrical members 147*a* into the holes 1415*a*, without greatly increasing the manufacturing cost of the substrate processing apparatus 1*c*.

Figure 29:
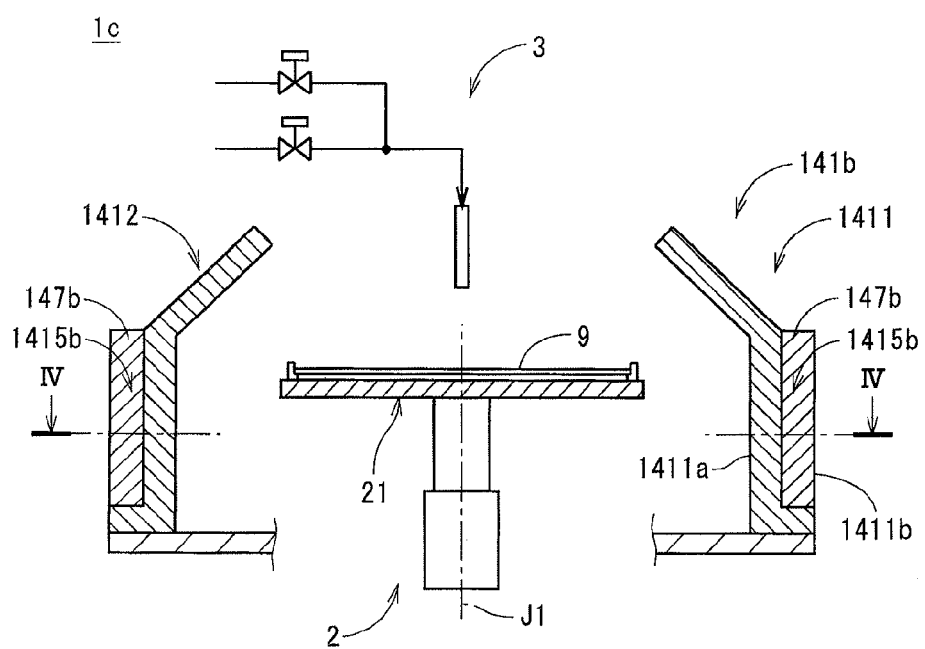
FIG. 29 is a view showing another example of the substrate processing apparatus.
Figure 30:
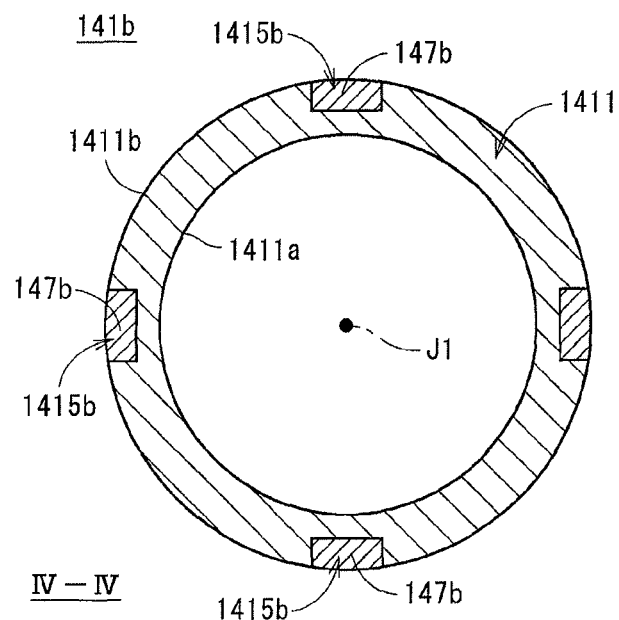
FIG. 30 is a cross-sectional view of a cup part.

FIG. 29 is a view showing another example of the substrate processing apparatus 1*c* and FIG. 30 is a cross-sectional view of a cup part 141*b* at the position indicated by the arrows IV-IV in FIG. 29. In the annular sidewall 1411 of the cup part 141*b* shown in FIGS. 29 and 30, a plurality of recessed portions 1415*b* each extending along the central axis J1 are formed on an outer annular surface 1411*b*, they are arranged in a circumferential direction of the cup part 141*b* at regular intervals, and a plate member 147*b* is fitted into each recessed portion 1415*b*. Actually, the thickness of the plate member 147*b* is made approximately the same as the depth of the recessed portion 1415*b* (the depth in a direction perpendicular to the central axis J1), and surfaces of the plate members 147*b*, which are opposite to the other surfaces facing the central axis J1, are included in the outer annular surface 1411*b* of the annular sidewall 1411. The plate member 147*b* is formed of ceramic with a dielectric constant which is higher than that of the main body of the cup part 141*b* formed of electrical insulation material (in the cup part 141*b* of FIG. 29, the main body is a part excluding the plate members 147*b* in the annular sidewall 1411).

As described above, in the case that the surface of the annular sidewall 1411 has the plate members 147*b* with a dielectric constant which is higher than that of the main body of the cup part 141*b*, the charge capacity of the annular sidewall 1411 becomes large, thereby suppressing the charged potential of the cup part 141*b* generated in splashing of the pure water. The cup part 141*b* of FIG. 29 can be easily produced at low cost only by providing the recessed portions 1415*b* in the annular sidewall 1411 formed of electrical insulation material and fitting the plate members 147*b* into the recessed portions 1415*b*. Depending on design of the substrate processing apparatus 1*c*, a member formed of ceramic may be provided on the outer annular surface 1411*b* of the annular sidewall 1411 in a ring shape.

In the cup parts 141, 141*a*, 141*b* of FIGS. 26, 28, and 30, the annular sidewall 1411 has the pure water 147, (a set of) the cylindrical members 147*a*, or (a set of) the plate members 147*b*, with a dielectric constant which is higher than that of the insulating main body, as an auxiliary dielectric material for increasing a charge capacity of the cup part 141, 141a, or 141b. The auxiliary dielectric material is provided as the internal portion of the annular sidewall 1411 or is provided on the surface of the annular sidewall 1411. As a result, it is possible to suppress the charged potential of the cup parts 141, 141a, 141b generated in splashing of the pure water, however, the above technique can be applied to a substrate processing apparatus having a plurality of cup parts.

Figure 31:
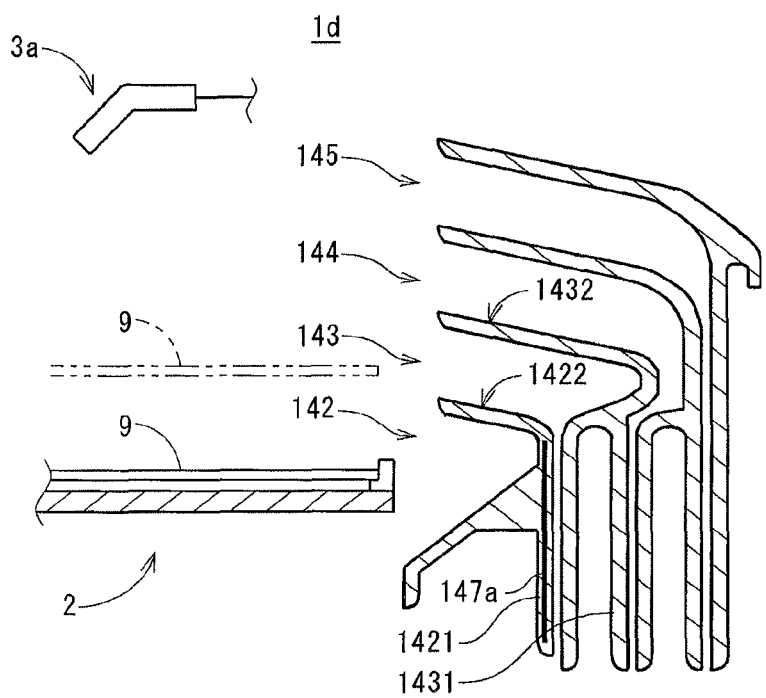
FIG. 31 is a view showing a part of a construction of a substrate processing apparatus having a plurality of cup parts.

FIG. 31 is a view showing a part of a construction of a substrate processing apparatus 1d having a plurality of cup parts 142 to 145 and only shows a right side of a cross section of the plurality of cup parts 142 to 145, the cross section being perpendicular to a substrate 9. In the substrate processing apparatus 1d of FIG. 31, a plurality of kinds of solution and pure water can be ejected from a processing liquid applying part 3a, and the plurality of cup parts 142 to 145 move as a unit. A position of the plurality of cup parts 142 to 145 relative to the substrate 9 is changed in accordance with a kind of processing liquid ejected from the processing liquid applying part 3a. For example, the substrate 9 is disposed in a position below an inclined part 1422 of an inner annular sidewall 1421 in a case where pure water is applied from the processing liquid applying part 3a (the position is shown by solid lines in FIG. 31 and hereinafter, referred to as "pure water applying position"). The substrate 9 is disposed in a position between the inclined part 1422 of the annular sidewall 1421 and an inclined part 1432 of an annular sidewall 1431 which is located outside the annular sidewall 1421, in a case where one type of solution is applied (the position is shown by a double-dashed line in FIG. 31). Also in the inner cup part 142 shown in FIG. 31, the cylindrical member 147a is provided in the annular sidewall 1421 similarly to the cup part 141a of FIG. 28 (Actually, the plurality of cylindrical members 147a are arranged in a circumferential direction of the annular sidewall 1421 at regular intervals). With this structure, it is possible to suppress the charged potential of the cup part 142 generated in splashing of the pure water and prevent occurrence of electric discharge on the substrate 9. Similarly to the cup part 141 of FIG. 25, pure water may be held in the annular sidewall 1421 as the internal portion.

Herein, discussion will be made on an example of an electric discharge phenomenon which occurs on a substrate in a substrate processing apparatus in accordance with a comparative example. The substrate processing apparatus has the same construction as the substrate processing apparatus 1d of FIG. 31 and the auxiliary dielectric material is not provided in the inner cup part. In the substrate processing apparatus of comparative example, pure water is applied onto the substrate in a state where the substrate is positioned in the pure water applying position, the pure water is splashed on the innermost cup part, and then the cup part is charged after the pure water is dripped from the cup part. Then, the main body of the substrate is charged by induction because of charging of the cup part. In this time, if the pure water remains on the substrate, $CO_2$ and the like normally dissolve into the pure water on the substrate, the pure water changes to water with conductivity, and consequently, electric discharge can occur on the substrate. Also, if the cup parts move up and down in a state where the water becoming conductive remains on the substrate, a relative position between the substrate and the charged cup part is changed to alter the potential of the main body of the substrate. As a result, electric discharge can occur on the substrate (that is to say, dielectric breakdown of an insulating film on the substrate occurs) when the cup parts move up and down.

On the other hand, in the substrate processing apparatus 1d of FIG. 31, since the cylindrical member 147a with a dielectric constant which is higher than that of the main body is provided in the annular sidewall 1421 of the cup part 142, it is possible to suppress the charged potential of the cup part caused by the splashed pure water. As a result, it is possible to prevent electric discharge from occurring on the substrate 9 due to charging of the cup part, in application of the processing solution onto the substrate 9, up and down movement of the cup parts 142 to 145, or the like. Also, it is possible to suppress adhesion of unwanted particles on the substrate which is caused by charging of the substrate.

Though the substrate processing apparatuses 1c, 1d in accordance with the fourth preferred embodiment have been discussed above, the substrate processing apparatuses 1, 1b allow various variations.

In the cup part 141 of FIG. 26, liquid other than water with a dielectric constant which is higher than that of the main body of the cup part 141 may be held in the annular sidewall 1411. However, since pure water is normally used in processing of the substrate 9, in a case where pure water is held in the annular sidewall 1411, even if pure water leaks from the annular sidewall 1411, the substrate 9 held in the cup part 141 is not affected.

A ring-shaped member formed of ceramic may be inserted in the ring-shaped groove 1415 in the cup part 141 of FIG. 26, and pure water is sealed within the holes 1415a in the cup part 141a of FIG. 28. It is possible to ensure constant strength without increasing thickness of the annular sidewall in a case where a member(s) of ceramic is provided in the cup part, and the material cost can be reduced in a case where pure water is held in the cup part. Naturally, portions of ceramic and portions of pure water may formed in the annular sidewall so that their positions in the circumferential direction are shifted mutually.

Though the plate members 147b can be provided in the inner annular surface 1411a of the cup part 141b in FIG. 30, in this case, it is required the plate members 147b have corrosion resistance against the solution (in the case that the inner annular surface 1411a of the cup part 141b has water repellency, the plate members 147b additionally have water repellency), and therefore, there is a possibility that surface treatment to the plate members 147b or the like must be performed. Therefore, it is preferable the surfaces of the plate members 147b are made to parts of the outer annular surface 1411b of the annular sidewall 1411 in order to easily providing the plate members 147b on the surface of the annular sidewall 1411.

In the cup parts 141a, 141b of FIGS. 28 and 30, the cylindrical members 147a or the plate members 147b are used as auxiliary elements. A set of four auxiliary elements, which are arranged in the circumferential direction of the annular sidewall 1411 at regular intervals, functions as the auxiliary dielectric material for increasing the charge capacity of the cup part, thereby suppressing the charged potential in each position of the cup part 141a or 141b. From the viewpoint of suppressing the charged potential in the nearly whole circumference of the cup part, it is important the auxiliary dielectric material is provided as a set of three or more auxiliary elements arranged in the circumferential direction of the annular sidewall 1411 at regular intervals.

The main body of the cup part is not necessarily formed of Teflon (trademark) but may be formed of electrical insulation material such as other fluorine resin or vinyl chloride resin. In the substrate processing apparatus, since the dielectric constant of the auxiliary dielectric material which is provided as the internal portion of the annular sidewall or is provided on the surface of the annular sidewall, is made higher than that of the electrical insulation material forming the main body of the cup part, it is possible to suppress the charged potential of the cup part generated in splashing of the pure water.

Although pure water and the solution are applied onto the substrate 9 from the processing liquid applying parts 3, 3a in the fourth preferred embodiment, even in an apparatus for only applying pure water, electric discharge can occur on a substrate in a state where water remains on the substrate as discussed above. Therefore, in a case where the substrate processing apparatus has a processing liquid applying part for applying at least pure water onto the substrate, it is important an auxiliary dielectric material with a dielectric constant which is higher than that of the main body of the cup part is provided as the internal portion of the annular sidewall or is provided on the surface of the annular sidewall to suppress the charged potential of the cup part.

Although the processing liquid splashed from the substrate 9, which is rotated by the substrate holding part 2, is received by the cup part in the substrate processing apparatuses 1c, 1d, there may be a case where, for example, the rotation mechanism is omitted in the substrate holding part, pure water is applied onto the substrate 9 held by the substrate holding part, and thereafter the pure water which is splashed from the substrate 9 by air from an air knife provided separately is received by the cup part. Also in this case, the above technique of suppressing the charged potential of the cup part should be used because the cup part is charged by the splashed pure water.

An object to be processed in the substrate processing apparatus may be a substrate such as a glass substrate, other than a semiconductor substrate.

While the invention has been shown and described in detail, the foregoing description is in all aspects illustrative and not restrictive. It is therefore understood that numerous modifications and variations can be devised without departing from the scope of the invention.

This application claims priority benefit under 35 U.S.C. Section 119 of Japanese Patent Application No. 2006-251637 filed in the Japan Patent Office on Sep. 15, 2006, Japanese Patent Application No. 2006-327938 filed in the Japan Patent Office on Dec. 5, 2006 and Japanese Patent Application No. 2006-328648 filed in the Japan Patent Office on Dec. 5, 2006, the entire disclosures of which are incorporated herein by reference.

What is claimed is:

1. A substrate processing apparatus for processing a substrate by applying processing liquid onto said substrate, comprising:
   a holding part for holding a substrate;
   a processing liquid applying part for applying pure water, which is one type of processing liquid, onto said substrate; and
   a cup part having a main body formed of electrical insulation material or semiconductor material, said cup part having an annular sidewall disposed radially surrounding a plane defined by a substrate held by said holding part to receive processing liquid splashed radially from said substrate, said annular sidewall having an internal annular space containing a material with a resistivity which is smaller than that of said electrical insulation material or said semiconductor material forming said main body.

2. The substrate processing apparatus according to claim 1, wherein
   said internal annular space extends continuously in a circumferential direction of said annular sidewall.

3. The substrate processing apparatus according to claim 1, wherein
   said internal annular space is a set of three or more elements which are arranged in a circumferential direction of said annular sidewall at regular intervals.

4. The substrate processing apparatus according to claim 1, wherein
   said material in said internal annular space is a conductive resin or conductive carbon.

5. The substrate processing apparatus according to claim 1, wherein
   said material in said internal annular space is a liquid.

6. The substrate processing apparatus according to claim 1, further comprising
   another cup part which has the same construction as said cup part and is located inside said cup part, a distance between said another cup part and said processing liquid applying part being longer than that between said cup part and said processing liquid applying part, wherein
   said cup part and said another cup part are movable relatively to said holding part in a normal direction of said substrate.

7. The substrate processing apparatus according to claim 1, further comprising
   another cup part having a whole annular sidewall formed of electrical insulation material or semiconductor material, said another cup part being located inside said cup part, a distance between said another cup part and said processing liquid applying part being longer than that between said cup part and said processing liquid applying part, wherein
   said cup part and said another cup part are movable relatively to said holding part in a normal direction of said substrate.

8. The substrate processing apparatus according to claim 1, further comprising
   a ground part for electrically grounding said internal portion.

9. A substrate processing apparatus for processing a substrate by applying processing liquid onto said substrate, comprising:
   a holding part for holding a substrate;
   a processing liquid applying part for applying pure water, which is one type of processing liquid, onto said substrate; and
   a cup part having a main body formed of electrical insulation material or semiconductor material, said cup part being disposed radially surrounding a plane defined by a substrate held by said holding part to receive processing liquid splashed radially from said substrate, said cup part having an inner annular surface and an outer annular surface, at least one surface of the inner annular surface and the outer annular surface of said cup part having a material thereon with a resistivity which is smaller than that of said main body.

10. The substrate processing apparatus according to claim 9, wherein
   said material extends continuously in a circumferential direction of said cup part.

11. The substrate processing apparatus according to claim 10, wherein
said material is a conductive resin film.

12. The substrate processing apparatus according to claim 9, wherein
said material is a set of three or more elements which are arranged in a circumferential direction of said cup part at regular intervals.

13. The substrate processing apparatus according to claim 9, further comprising
a ground part for electrically grounding said material.

14. The substrate processing apparatus according to claim 9, wherein
said at least one surface includes said inner annular surface.

15. The substrate processing apparatus according to claim 9, wherein
said at least one surface is said outer annular surface, and said inner annular surface has water repellency.

16. The substrate processing apparatus according to claim 9, further comprising
another cup part formed of the same material as said cup part, at least one surface of an inner annular surface and an outer annular surface of said another cup part being formed in the same manner as said at least one surface of said inner annular surface and said outer annular surface of said cup part, said another cup part being located inside said cup part, a distance between said another cup part and said processing liquid applying part being longer than that between said cup part and said processing liquid applying part, wherein
said cup part and said another cup part are movable relatively to said holding part in a normal direction of said substrate.

17. The substrate processing apparatus according to claim 9, further comprising
another cup part formed of the same material as said cup part, an inner annular surface and an outer annular surface of said another cup part being surfaces of said material, said another cup part being located inside said cup part, a distance between said another cup part and said processing liquid applying part being longer than that between said cup part and said processing liquid applying part, wherein
said cup part and said another cup part are movable relatively to said holding part in a normal direction of said substrate.

18. A substrate processing apparatus for processing a substrate by applying processing liquid onto said substrate, comprising:
a holding part for holding a substrate;
a processing liquid applying part for applying pure water, which is one type of processing liquid, onto said substrate;
at least one cup part being formed of electrical insulation material or semiconductor material and disposed radially surrounding a plane defined by a substrate held by said holding part to receive processing liquid splashed radially from said substrate; and
a cylindrical member which is provided closely surrounding an outer annular surface of said at least one cup part, said cylindrical member having a resistivity which is smaller than that of said at least one cup part.

19. The substrate processing apparatus according to claim 18, wherein said cylindrical member is formed of metal.

20. The substrate processing apparatus according to claim 18, wherein said at least one cup part comprises a concentric plurality of said cup parts, and said cylindrical member is provided closely surrounding an outer annular surface of an outermost cup part of said plurality of cup parts.

* * * * *